United States Patent
Kaneko et al.

(10) Patent No.: US 12,038,692 B2
(45) Date of Patent: Jul. 16, 2024

(54) METHOD FOR PRODUCING SUBSTRATE WITH PATTERNED FILM AND FLUORINE-CONTAINING COPOLYMER

(71) Applicant: CENTRAL GLASS COMPANY, LIMITED, Ube (JP)

(72) Inventors: Yuzuru Kaneko, Saitama (JP); Takashi Aoki, Saitama (JP); Yusuke Nomura, Saitama (JP); Keiko Sasaki, Saitama (JP); Asuka Sano, Saitama (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 794 days.

(21) Appl. No.: 17/057,528

(22) PCT Filed: May 23, 2019

(86) PCT No.: PCT/JP2019/020482
§ 371 (c)(1),
(2) Date: Nov. 20, 2020

(87) PCT Pub. No.: WO2019/225702
PCT Pub. Date: Nov. 28, 2019

(65) Prior Publication Data
US 2021/0317245 A1  Oct. 14, 2021

(30) Foreign Application Priority Data
May 23, 2018 (JP) ................................ 2018-098679

(51) Int. Cl.
*G03F 7/38* (2006.01)
*C08F 220/22* (2006.01)
*C08F 236/16* (2006.01)
*G03F 7/00* (2006.01)
*G03F 7/038* (2006.01)
*G03F 7/039* (2006.01)
*H01L 21/02* (2006.01)
*H01L 21/3065* (2006.01)
*H01L 33/00* (2010.01)
*H01L 33/44* (2010.01)
*H10K 50/115* (2023.01)
*H10K 71/00* (2023.01)
*H10K 71/13* (2023.01)
*G03F 7/20* (2006.01)

(52) U.S. Cl.
CPC .............. *G03F 7/38* (2013.01); *C08F 220/22* (2013.01); *C08F 236/16* (2013.01); *G03F 7/0002* (2013.01); *G03F 7/0382* (2013.01); *G03F 7/0392* (2013.01); *H01L 21/02046* (2013.01); *H01L 21/3065* (2013.01); *H01L 33/005* (2013.01); *H01L 33/44* (2013.01); *H10K 50/115* (2023.02); *H10K 71/00* (2023.02); *H10K 71/135* (2023.02); *G03F 7/2006* (2013.01); *H01L 2933/0025* (2013.01)

(58) Field of Classification Search
CPC ............................ G03F 7/38; H01L 21/02046
See application file for complete search history.

(56) References Cited

U.S. PATENT DOCUMENTS

| | | | |
|---|---|---|---|
| 3,607,850 A | 9/1971 | Smith | |
| 9,337,020 B2* | 5/2016 | Takachi | H01L 21/0337 |
| 9,541,789 B2* | 1/2017 | Jang | G02B 5/3058 |
| 2004/0155578 A1* | 8/2004 | Ito | H10K 71/231 |
| | | | 313/506 |
| 2010/0209855 A1* | 8/2010 | Tanaka | H01L 21/0274 |
| | | | 430/319 |
| 2016/0181531 A1* | 6/2016 | Terui | G03F 7/0046 |
| | | | 257/40 |
| 2017/0158905 A1 | 6/2017 | Oomatsu et al. | |

FOREIGN PATENT DOCUMENTS

| | | | |
|---|---|---|---|
| JP | 50-1004 B | 1/1975 | |
| JP | 10-197715 | 7/1998 | |
| JP | 11-054270 | 2/1999 | |
| JP | 2000-353594 | 12/2000 | |
| JP | 2003-238620 | 8/2003 | |
| JP | 2003-300939 | 10/2003 | |
| JP | 2004-111220 | 4/2004 | |
| JP | 2005-008863 | 1/2005 | |
| JP | 2012-146444 | 8/2012 | |
| JP | 2012-220860 | 11/2012 | |
| JP | 2015-038976 | 2/2015 | |
| JP | 2017-049327 | 3/2017 | |
| TW | 200921297 A * | 5/2009 | ............... G03F 7/38 |
| TW | 201609929 | 3/2016 | |
| WO | 2004/073566 | 9/2004 | |
| WO | WO-2010116646 A1 * | 10/2010 | ............... G03F 1/68 |
| WO | 2017/126610 | 7/2017 | |

OTHER PUBLICATIONS

Machine translation of written opinion ETWOS (no date).*
Machine translation of JP 2017-049327 (no date).*
Machine translation of JP 2012-146444 (no date).*

* cited by examiner

*Primary Examiner* — Amanda C. Walke
(74) *Attorney, Agent, or Firm* — HSML P.C.

(57) ABSTRACT

The production method of a substrate with a patterned film according to the present disclosure includes: a cleaning step of performing UV/ozone cleaning or oxygen plasma cleaning on a substrate with a patterned film to obtain a first substrate with a patterned film, the substrate with a patterned film including a substrate and a patterned film on the substrate, the patterned film containing a fluorine-containing copolymer having a specific repeating unit; and a heating step of heating the first substrate with a patterned film to obtain a second substrate with a patterned film.

17 Claims, No Drawings

METHOD FOR PRODUCING SUBSTRATE WITH PATTERNED FILM AND FLUORINE-CONTAINING COPOLYMER

TECHNICAL FIELD

The present disclosure relates to a method for producing a substrate with a patterned film, and a fluorine-containing copolymer. The production method of a substrate with a patterned film of the present disclosure can be used, for example, for production of a display element by an ink-jet method. Examples of the display element include an organic electroluminescence display (hereafter, referred to as an organic EL display), a micro light emitting diode display (hereafter, referred to as a micro-LED display), and a quantum dot display.

BACKGROUND ART

An ink-jet method is known to be employed for production of display elements such as an organic EL display, a micro-LED display, and a quantum dot display.

Examples of a production method of these display elements by an ink-jet method include a method of forming a pattern by unevenness of a film on a substrate and dropping ink through a nozzle onto the recesses of the pattern, followed by solidifying of the ink, and a method of forming a patterned film including a lyophilic part to be wetted with ink and a lyophobic part that repels ink on a substrate in advance and dropping ink on the patterned film to adhere the ink to the lyophilic part.

In the method of dropping ink through a nozzle onto depressions (recesses) of the patterned film having unevenness and solidifying the ink, such a patterned film is produced by photolithography or imprinting. In the photolithography, a resist film formed on a substrate is exposed in a pattern, whereby a pattern including an exposed part and an unexposed part is formed. Either one part is dissolved in a developing solution to provide the resist film with unevenness. In the imprinting, a patterned film with unevenness is formed on a substrate by a printing technique. In such a patterned film with unevenness, the substrate surface is preferably exposed in the recesses and the exposed substrate surface is preferably lyophilic.

In an ink-jet method, a protrusion of a patterned film with unevenness is called a bank. The bank serves as a barrier for preventing mixing of ink upon dropping of ink onto the recesses of the patterned film by ink-jetting.

For example, Patent Literature 1 discloses a composition for an organic EL element used as ink in the production of an organic EL display by an ink-jet method. According to Patent Literature 1, a bank is formed on a substrate in advance, and ink (a composition for an organic EL element) to be formed into a light emitting layer is dropped, whereby a display element for an organic EL display is produced.

Patent Literature 2 discloses a method for producing a color filter for a liquid crystal, including forming a photosensitive compound layer containing a hydrophobic and lipophobic compound having a surface tension or a critical surface tension of $2.5 \times 10^{-2}$ [N/m] or less by photolithography on a light shielding part formed on a light-transmitting substrate, and arranging a colorant on a light-transmitting part of the substrate by ink ejection using an ink-jet recorder. According to Patent Literature 2, the presence of a fluoropolymer or a fluorochemical surfactant in the photosensitive compound layer forming a bank enhances the lyophobicity of the bank and such a bank prevents intrusion of ink over the bank into the adjacent recess upon dropping of the ink onto the recesses of the patterned film by ink-jetting.

Patent Literature 3 discloses a lyophobic resist composition for obtaining a pattern including a lyophobic region and a lyophilic region by photolithography. According to Patent Literature 3, the use of the lyophobic resist composition enables formation of a lyophobic/lyophilic pattern having a clear ink-wetting contrast by an ink-jet method. The substrate surface serving as a recess is made lyophilic and the bank surface is made lyophobic for the purpose of preventing intrusion of ink over the bank into the adjacent recess upon dropping of the ink onto the recesses of the patterned film by an ink-jet method.

Patent Literature 4 discloses a patterning substrate used in an ink-jet method. The patterning substrate contains a thin film including a bank having a predetermined height and a region to be coated which is partitioned by the bank. According to Patent Literature 4, the region to be coated which is a recess is lyophilic and the bank which is a protrusion is lyophobic.

Patent Literature 5 discloses a positive photosensitive resin composition that is capable of forming an image and provides a cured film having high hydrophobicity and lipophobicity on the surface. According to Patent Literature 5, the positive photosensitive resin composition is suitably used for an interlayer insulating film in s display device such as a liquid crystal display or an EL display, and a light shielding material and partition material each compatible with an ink-jet method.

According to Patent Literatures 4 and 5, a recess of a patterned film is lyophobic due to failures such as organic contamination of the substrate surface as the recess of the patterned film in the case of forming the patterned film on a substrate by photolithography and film residues on the recess of the patterned film in the case of forming the patterned film by imprinting. Therefore, the substrate with a patterned film provided using a hydrophilic ink is subjected to hydrophilization, so that the recess of the patterned film is made hydrophilic. The hydrophilization allows the recess of the patterned film not to repel ink in ink-jetting. Accordingly, dropping of ink onto the substrate with a patterned film is facilitated.

According to Patent Literature 4, contact between a substrate with a patterned film and oxygen plasma gas and fluorine plasma gas allows the substrate surface that is a recess of the patterned film to have hydrophilicity and the bank that is a protrusion of the patterned film to have hydrophobicity.

According to Patent Literature 5, the positive photosensitive resin composition of the disclosure can provide a substrate with a patterned film in which the surface of the patterned film serving as a bank maintains high lyophobicity even after UV/ozone cleaning during the hydrophilization.

CITATION LIST

Patent Literature

Patent Literature 1: JP H11-54270 A
Patent Literature 2: JP H10-197715 A
Patent Literature 3: JP 2012-220860 A
Patent Literature 4: JP 2000-353594 A
Patent Literature 5: WO 2017/126610

SUMMARY OF INVENTION

Technical Problem

As described in Patent Literatures 4 and 5, UV/ozone cleaning or oxygen plasma cleaning is performed on a substrate with a patterned film for the purpose of increasing the lyophilicity of the substrate surface that is a recess of the patterned film. Unfortunately, the cleaning lowers the lyophobicity of the bank. In such a case, upon dropping of ink onto the recess of the patterned film by an ink-jet method, the ink may climb over the bank or the bank may be dissolved in the ink.

The present disclosure provides a production method of a substrate with a patterned film for solving the above problem. The present disclosure also provides a novel fluorine-containing copolymer contained in the patterned film.

Solution to Problem

The present inventors made intensive studies to solve the above problem, and found out the following fact. UV/ozone cleaning or oxygen plasma cleaning performed on a substrate with a patterned film containing a specific fluorine-containing copolymer lowers the lyophobicity of the patterned film once. However, heating treatment performed thereafter provides the lyophobicity (recovers the lyophobicity).

A patterned film containing a specific fluorine-containing copolymer after UV/ozone cleaning or oxygen plasma cleaning showed lower lyophobicity against water and anisole used as an ink solvent in an ink-jet method. Heating of the patterned film however recovered the lyophobicity against both water and anisole (see Tables 2 and 3 of EXAMPLES herein). Similarly, a patterned film containing a specific fluorine-containing copolymer after UV/ozone cleaning or oxygen plasma cleaning also showed lower lyophobicity against propylene glycol monomethyl ether acetate (PGMEA) and xylene. Heating of the patterned film however recovered the lyophobicity against both PGMEA and xylene (see Tables 4 and 5 of EXAMPLES herein). As described above, the present inventors found out that heating of a patterned film containing a specific fluorine-containing copolymer after UV cleaning unexpectedly remarkably recovers the lyophobicity.

The surface of a patterned film subjected to UV/ozone cleaning or oxygen plasma cleaning is oxidized to be lyophilic. However, owing to the use of a special fluorine-containing copolymer capable of suppressing cleavage of the polymer main chain, presumably, alkyl fluoride parts having a small surface free energy move to the film surface along with the molecular motion caused by heating, whereby the lyophobicity is recovered.

UV/ozone cleaning herein refers to a method of removing organic contaminants. In the method, a substrate with a patterned film is irradiated with UV rays for decomposition of binding of organic contaminants adhering to the patterned film and a recess of the substrate with a patterned film, and at the same time, active oxygen separated from ozone generated by UV irradiation chemically binds to the organic contaminants to decompose the organic contaminants to volatile matters such as carbon dioxide and water. Thus, organic contaminants are removed. The UV irradiation device typically used is a low-pressure mercury lamp.

Oxygen plasma cleaning herein refers to a method of removing organic contaminants. In the method, a high voltage is applied to gas containing oxygen molecules to dissociate oxygen molecules, thereby generating active oxygen. The active oxygen decomposes organic contaminants adhering to the surface of the substrate with a patterned film to volatile matters such as carbon dioxide and water. Thus, organic contaminants are removed.

The following inventions 1 to 17 are disclosed.

[Invention 1]

A method for producing a substrate with a patterned film, the method including:

a cleaning step of performing UV/ozone cleaning or oxygen plasma cleaning on a substrate with a patterned film to obtain a first substrate with a patterned film, the substrate with a patterned film including a substrate and a patterned film on the substrate, the patterned film containing a fluorine-containing copolymer, the fluorine-containing copolymer containing both a repeating unit represented by the following formula (A) and a repeating unit represented by the following formula (C); and a heating step of heating the first substrate with a patterned film to obtain a second substrate with a patterned film, the formulas (A) and (C) being:

[Chem. 1]

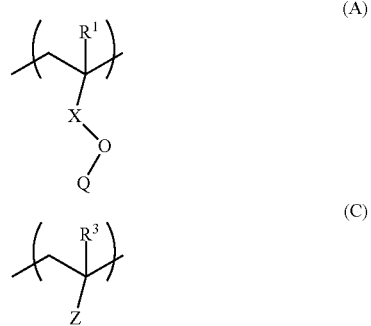

wherein $R^1$ and $R^3$ are each independently a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X is a single bond or a divalent group; Z is a C1-C20 alkyl group, a C2-C20 alkenyl group, a C2-C20 alkynyl group, a C6-C20 phenyl group, a C1-C20 alkoxy group, or a C1-C20 alkyl carbonyloxy group or carboxyl group, and a hydrogen atom in any of the foregoing groups is optionally replaced by a fluorine atom, an oxygen atom, or a nitrogen atom; and O is an oxygen atom.

[Invention 2]

The production method according to Invention 1, wherein the fluorine-containing copolymer contains all of the repeating unit represented by the following formula (A), a repeating unit represented by the following formula (B), and the repeating unit represented by the following formula (C), the formulas (A), (B), and (C) being:

[Chem. 2]

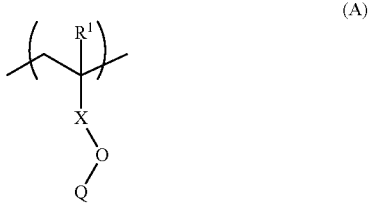

-continued

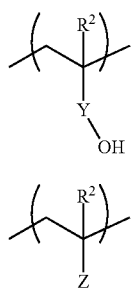
(B)

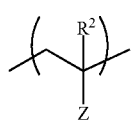
(C)

wherein $R^1$, $R^2$, and $R^3$ are each independently a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X and Y are each independently a single bond or a divalent group; Z is a C1-C20 alkyl group, a C2-C20 alkenyl group, a C2-C20 alkynyl group, a C6-C20 phenyl group, a C1-C20 alkoxy group, or a C1-C20 alkyl carbonyloxy group or carboxyl group, and a hydrogen atom in any of the foregoing groups is optionally replaced by a fluorine atom, an oxygen atom, or a nitrogen atom; 0 is an oxygen atom; and H is a hydrogen atom.

[Invention 3]

The production method according to Invention 1 or 2, wherein the first substrate with a patterned film is heated at 50° C. or higher but 350° C. or lower for 10 seconds or longer in the heating step.

[Invention 4]

The production method according to any one of Inventions 1 to 3, wherein the second substrate with a patterned film is a substrate for forming a display element by an ink-jet method.

[Invention 5]

The production method according to any one of Inventions 1 to 4, wherein Q is a C3-C10 fluoroalkyl group and X is a carbonyl group in the repeating unit represented by the formula (A).

[Invention 6]

The production method according to Invention 5, wherein Q is a perfluorohexyl ethyl group and X is a carbonyl group in the repeating unit represented by the formula (A).

[Invention 7]

The production method according to Invention 5, wherein Q is a hexafluoroisopropyl group and X is a carbonyl group in the repeating unit represented by the formula (A).

[Invention 8]

The production method according to any one of Inventions 1 to 4, wherein the repeating unit represented by the formula (A) is a repeating unit represented by the following formula (A-1):

[Chem. 3]

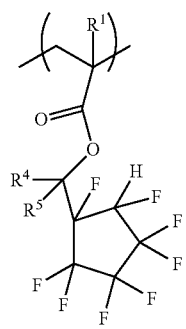
(A-1)

wherein $R^4$ and $R^5$ are each independently a hydrogen atom, a fluorine atom, or a C1-C3 alkyl group in which hydrogen atoms bonded to a carbon atom are optionally partly or entirely replaced by fluorine atoms; O is an oxygen atom; H is a hydrogen atom; and F is a fluorine atom.

[Invention 9]

The production method according to any one of Inventions 2 to 4, wherein Q is a hexafluoroisopropyl group and X is a carbonyl group in the repeating unit represented by the formula (A), and Y is a p-phenylene group or a carboxyethylene group in the repeating unit represented by the formula (B).

[Invention 10]

The production method according to any one of Inventions 2 to 4, wherein Q is a hexafluoroisopropyl group and X is a carbonyl group in the repeating unit represented by the formula (A), Y is a p-phenylene group or a carboxyethylene group in the repeating unit represented by the formula (B), and Z is an alkoxy group, a carboxyl group, an acetoxy group, or a bis(trifluoromethyl)vinyl group in the repeating unit represented by the formula (C).

[Invention 11]

The production method according to any one of Inventions 2 to 4, wherein Z is a bis(trifluoromethyl)vinyl group in the repeating unit represented by formula (C).

[Invention 12]

The production method according to any one of Inventions 2 to 4, wherein Q is a C3-C10 fluoroalkyl group and X is a carbonyl group in the repeating unit represented by the formula (A), Y is a p-phenylene group, a p-phenylene carbonyl group, or a p-phenylene hexafluoroisopropylene group in the repeating unit represented by the formula (B), and Z is a bis(trifluoromethyl)vinyl group in the repeating unit represented by the formula (C).

[Invention 13]

A fluorine-containing copolymer including both a repeating unit represented by the following formula (A) and a repeating unit represented by the following formula (C):

[Chem. 4]

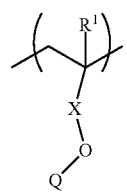
(A)

(C)

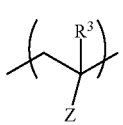

wherein $R^1$ and $R^3$ are each independently a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X is a single bond or a divalent group; Z is a C1-C20 alkyl group, a C2-C20 alkenyl group, a C2-C20 alkynyl group, a C6-C20 phenyl group, a C1-C20 alkoxy group, or a C1-C20 alkyl carbonyloxy group or carboxyl group, and a hydrogen atom in any of the foregoing groups is optionally replaced by a fluorine atom, an oxygen atom, or a nitrogen atom; and O is an oxygen atom.

[Invention 14]

The fluorine-containing copolymer according to Invention 13, wherein Q is a C3-C10 fluoroalkyl group and X is a carbonyl group in the repeating unit represented by the formula (A), and Z is a bis(trifluoromethyl)vinyl group in the repeating unit represented by the formula (C).

[Invention 15]

A fluorine-containing copolymer including all of a repeating unit represented by the following formula (A), a repeating unit represented by the following formula (B), and a repeating unit represented by the following formula (C):

[Chem. 5]

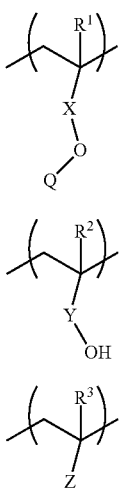

wherein $R^1$, $R^2$, and $R^3$ are each independently a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X and Y are each independently a single bond or a divalent group; Z is a C1-C20 alkyl group, a C2-C20 alkenyl group, a C2-C20 alkynyl group, a C6-C20 phenyl group, a C1-C20 alkoxy group, or a C1-C20 alkyl carbonyloxy group or carboxyl group, and a hydrogen atom in any of the foregoing groups is optionally replaced by a fluorine atom, an oxygen atom, or a nitrogen atom; 0 is an oxygen atom; and H is a hydrogen atom.

[Invention 16]

The fluorine-containing copolymer according to Invention 15, wherein Q is a hexafluoroisopropyl group and X is a carbonyl group in the repeating unit represented by the formula (A), Y is a carboxyethylene group in the repeating unit represented by the formula (B), and $R^3$ is a hydrogen atom or a methyl group and Z is a C1-C4 alkyl carbonyloxy group in the repeating unit represented by the formula (C).

[Invention 17]

The fluorine-containing copolymer according to Invention 15, wherein Q is a C3-C10 fluoroalkyl group and X is a carbonyl group in the repeating unit represented by the formula (A), Y is a p-phenylene group, a p-phenylene carbonyl group, or a p-phenylene hexafluoroisopropylene group in the repeating unit represented by the formula (B), and $R^3$ is a hydrogen atom or a methyl group and Z is a bis(trifluoromethyl)vinyl group in the repeating unit represented by the formula (C).

Advantageous Effects of Invention

According to the production method of a substrate with a patterned film of the present disclosure, a patterned film can have sufficient lyophobicity while maintaining the lyophilicity of a substrate surface that is a recess of the patterned film. Even after UV/ozone cleaning or oxygen plasma cleaning of the surface of the patterned film, the lyophobicity of the patterned film can be recovered by heating of the patterned film.

DESCRIPTION OF EMBODIMENTS

The present invention is not limited to the following embodiments, and modifications or changes may be suitably made based on the conventional knowledge of a person skilled in the art without departing from the gist of the present invention. It should be understood that such a modified or changed invention is also encompassed by the present invention.

1. Heating Treatment after UV/Ozone Cleaning or Oxygen Plasma Cleaning

The production method of a substrate with a patterned film of the present disclosure includes a cleaning step of performing UV/ozone cleaning or oxygen plasma cleaning on a substrate with a patterned film to obtain a first substrate with a patterned film, and a heating step of heating the first substrate with a patterned film to obtain a second substrate with a patterned film.

The heating temperature in the heating step is preferably 50° C. or higher but 350° C. or lower, more preferably 100° C. or higher but 300° C. or lower, still more preferably 150° C. or higher but 250° C. or lower. The heating temperature of lower than 50° C. is not likely to provide the effect of recovering the lyophobicity of the substrate with a patterned film, which has been lowered by UV/ozone cleaning or oxygen plasma cleaning, to the same or substantially the same level as that before UV/ozone cleaning or oxygen plasma cleaning.

The upper limit of the heating time is not limited, and the heating time is preferably adjusted in accordance with the heat resistance of the photoresist used for pattern formation of the substrate with a patterned film. Though not limited, the upper limit of the heating time is practically one hour or shorter. The lower limit of the heating time is preferably 10 seconds or longer, more preferably 30 seconds or longer.

The heating time of shorter than 10 seconds is not likely to provide the effect of recovering the lyophobicity of the substrate with a patterned film, which has been lowered by UV/ozone cleaning or oxygen plasma cleaning, to the same or substantially the same level as that before UV/ozone cleaning or oxygen plasma cleaning.

The heating means used may be a commonly available heating device. Examples thereof include a hot plate and an oven.

The heating may be performed in an environment, such as in nitrogen gas or under reduced pressure. Preferably, the heating is performed in the atmosphere (air) at normal pressure (101.325 kPa) as a commercially available heating device is usable.

According to the production method of a substrate with a patterned film of the present disclosure, a substrate with a patterned film including a substrate and a patterned film that contains a fluorine-containing copolymer containing a specific repeating unit formed on the substrate is heated after UV/ozone cleaning or oxygen plasma cleaning, which reduces the problem that, upon dropping of ink onto a recess of the patterned film of the substrate with a patterned film by an ink-jet method, the ink climbs over a bank or the bank is dissolved in the ink.

2. Fluorine-Containing Copolymer

In the production method of a substrate with a patterned film of the present disclosure, the substrate with a patterned film includes a substrate and a patterned film on the substrate. The patterned film contains a fluorine-containing copolymer. The fluorine-containing copolymer contains both a repeating unit represented by the formula (A) and a repeating unit represented by the formula (C).

[Fluorine-Containing Copolymer Containing Both a Repeating Unit Represented by the Formula (A) and a Repeating Unit Represented by the Formula (C)]

In the production method of a substrate with a patterned film of the present disclosure, the fluorine-containing copolymer contains both a repeating unit represented by the following formula (A) (hereafter, also referred to as a repeating unit (A)) and a repeating unit represented by the following formula (C) (hereafter, also referred to as a repeating unit (C)).

[Chem. 6]

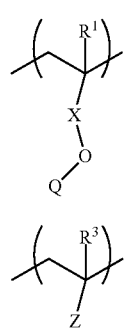

(A)

(C)

(In the formulas, $R^1$ and $R^3$ are each independently a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X is a single bond or a divalent group; Z is a C1-C20 alkyl group, a C2-C20 alkenyl group, a C2-C20 alkynyl group, a C6-C20 phenyl group, a C1-C20 alkoxy group, or a C1-C20 alkyl carbonyloxy group or carboxyl group, and a hydrogen atom in any of the foregoing groups is optionally replaced by a fluorine atom, an oxygen atom, or a nitrogen atom; and O is an oxygen atom.)

Preferably, Q is a C3-C10 fluoroalkyl group and X is a carbonyl group (—C(=O)—) in the repeating unit represented by the formula (A), and Z is a bis(trifluoromethyl) vinyl group (—CH=C(CF$_3$)$_2$) in the repeating unit represented by the formula (C).

Preferred combinations of the repeating unit (A) and the repeating unit (C) are listed below.

[Chem. 7]

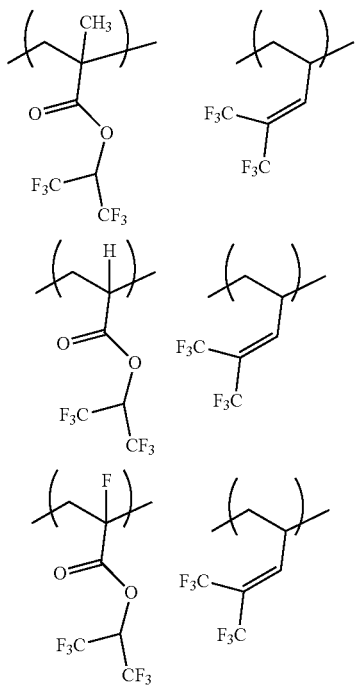

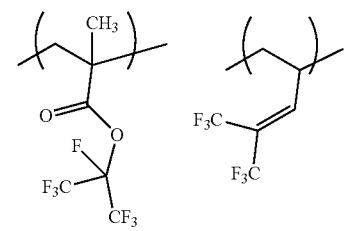

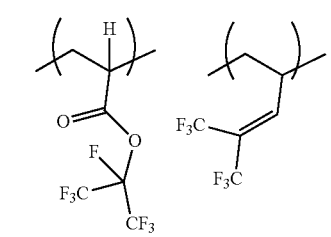

-continued
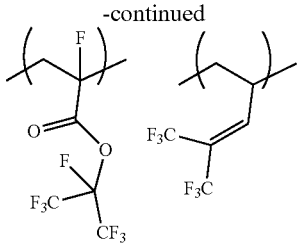 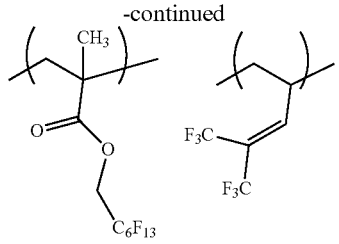
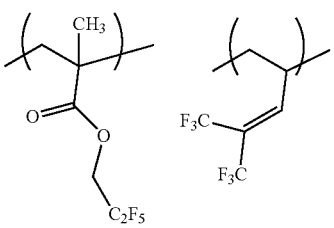 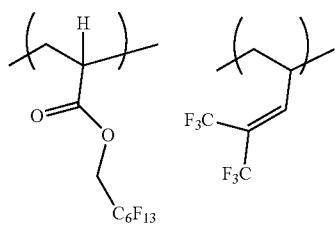
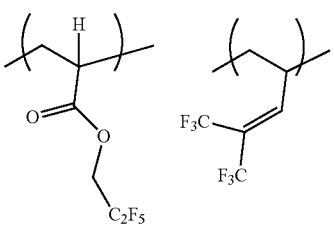 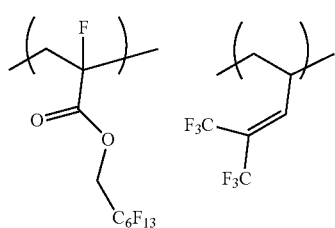
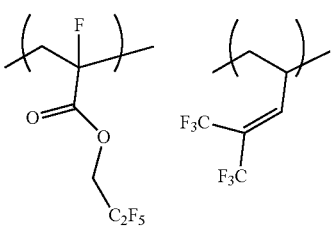 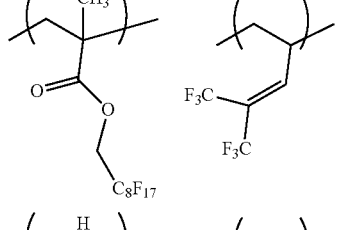
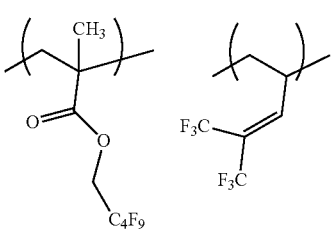 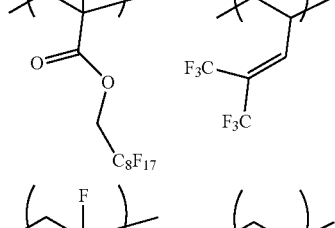
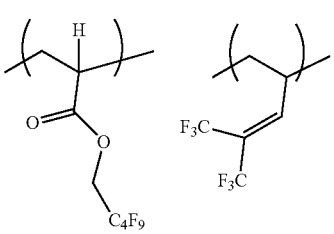 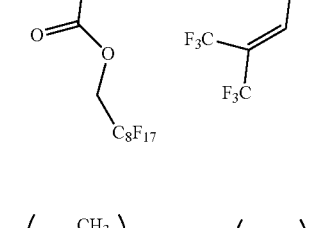
[Chem. 8]
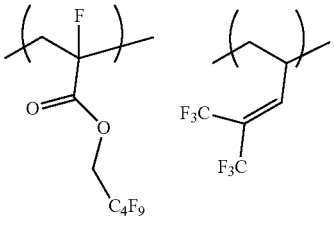 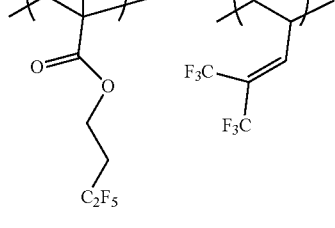

-continued

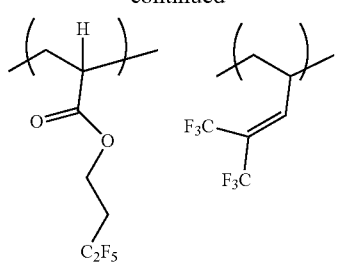 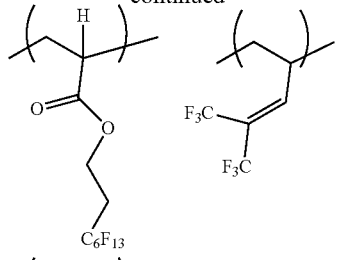

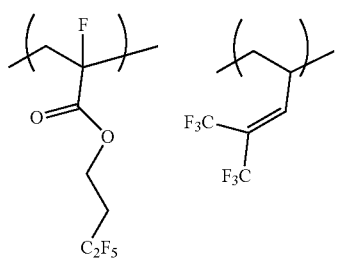 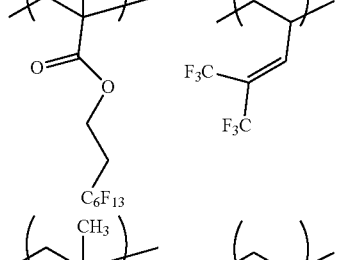

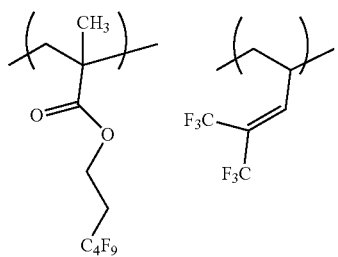 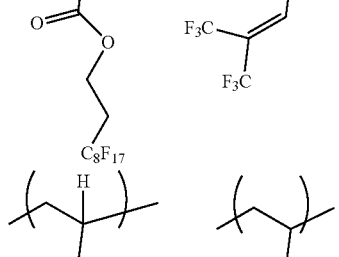

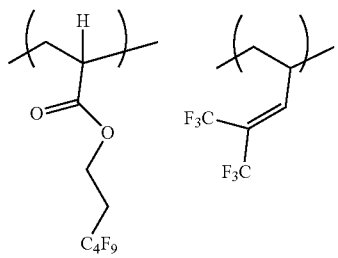 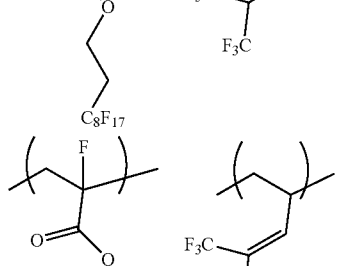

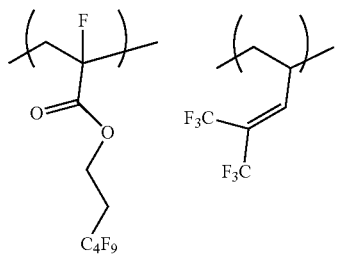 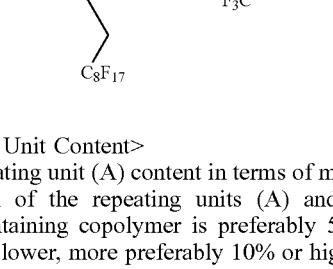

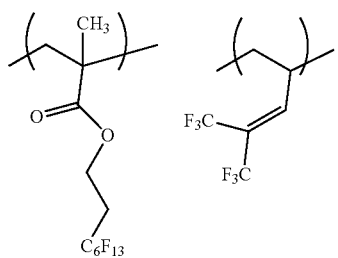

<Repeating Unit Content>

The repeating unit (A) content in terms of mol % relative to the sum of the repeating units (A) and (C) in the fluorine-containing copolymer is preferably 5% or higher but 80% or lower, more preferably 10% or higher but 60% or lower.

The repeating unit (C) content in terms of mol % relative to the sum of the repeating units (A) and (C) in the fluorine-containing copolymer is preferably 3% or higher but 90% or lower, more preferably 5% or higher but 80% or lower.

The fluorine-containing copolymer may contain, if necessary, a repeating unit other than the repeating units (A) and (C) for the purpose of improving the solubility in an organic solvent or adhesiveness to a substrate or hardness when formed into a film. The repeating unit content other than the repeating units (A) and (C) in terms of mol % relative to the sum of the repeating units (A) and (C) is preferably 50% or lower, more preferably 30% or lower. The repeating unit content other than the repeating units (A) and (C) of higher than 50% tends to fail to achieve the lyophobicity.

[Fluorine-Containing Copolymer Containing all of a Repeating Unit Represented by the Formula (A), a Repeating Unit Represented by the Formula (B), and a Repeating Unit Represented by the Formula (C)]

In the production method of a substrate with a patterned film of the present disclosure, the fluorine-containing copolymer preferably contains all of a repeating unit represented by the following formula (A), a repeating unit represented by the following formula (B) (hereafter, also referred to as a repeating unit (B)), and a repeating unit represented by the formula (C).

[Chem. 9]

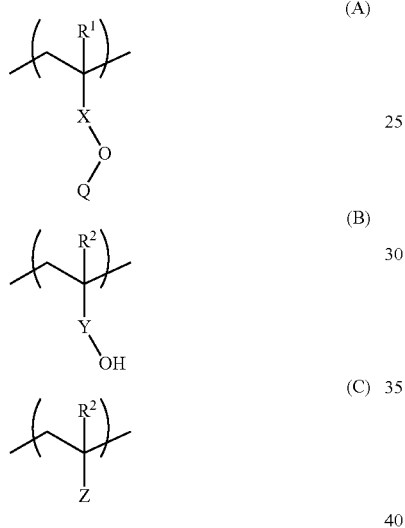

(In the formulas, $R^1$, $R^2$, and $R^3$ are each independently a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X and Y are each independently a single bond or a divalent group; Z is a C1-C20 alkyl group, a C2-C20 alkenyl group, a C2-C20 alkynyl group, a C6-C20 phenyl group, a C1-C20 alkoxy group, or a C1-C20 alkyl carbonyloxy group or carboxyl group, and a hydrogen atom in any of the foregoing groups is optionally replaced by a fluorine atom, an oxygen atom, or a nitrogen atom; 0 is an oxygen atom; and H is a hydrogen atom.)

In the fluorine-containing copolymer, preferably, Q is a hexafluoroisopropyl group (—CH(CF$_3$)$_2$) and X is a carbonyl group (—C(=O)—) in the repeating unit represented by the formula (A), Y is a carboxyethylene group (—C(=O)—O—CH$_2$CH$_2$—) in the repeating unit represented by the formula (B), and $R^3$ is a hydrogen atom or a methyl group and Z is a C1-C4 alkyl carbonyloxy group in the repeating unit represented by the formula (C).

Preferred combinations of the repeating unit (A), the repeating unit (B), and the repeating unit (C) are listed below.

[Chem. 10]

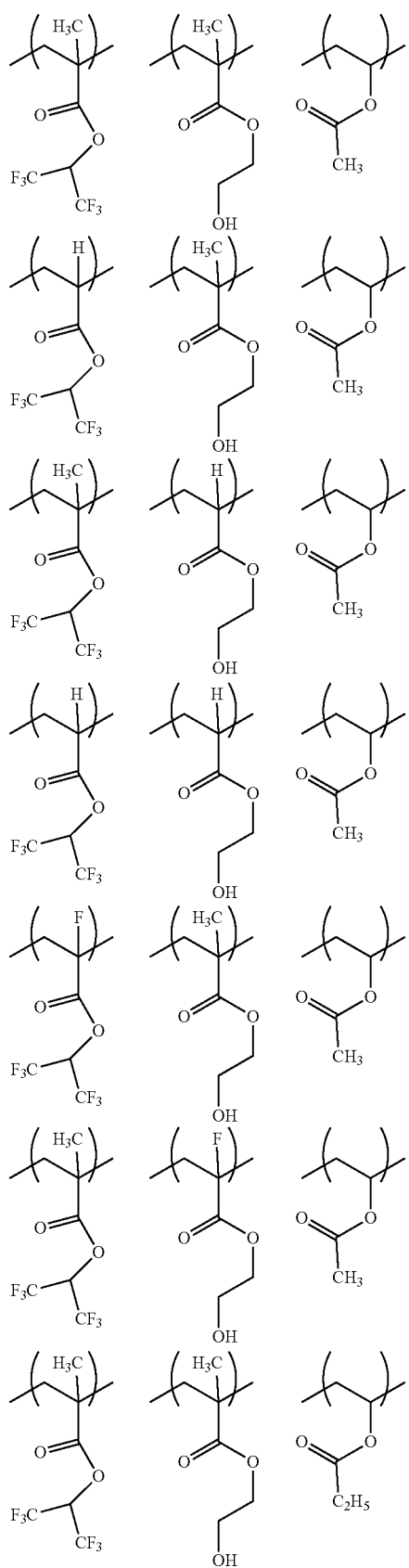

-continued

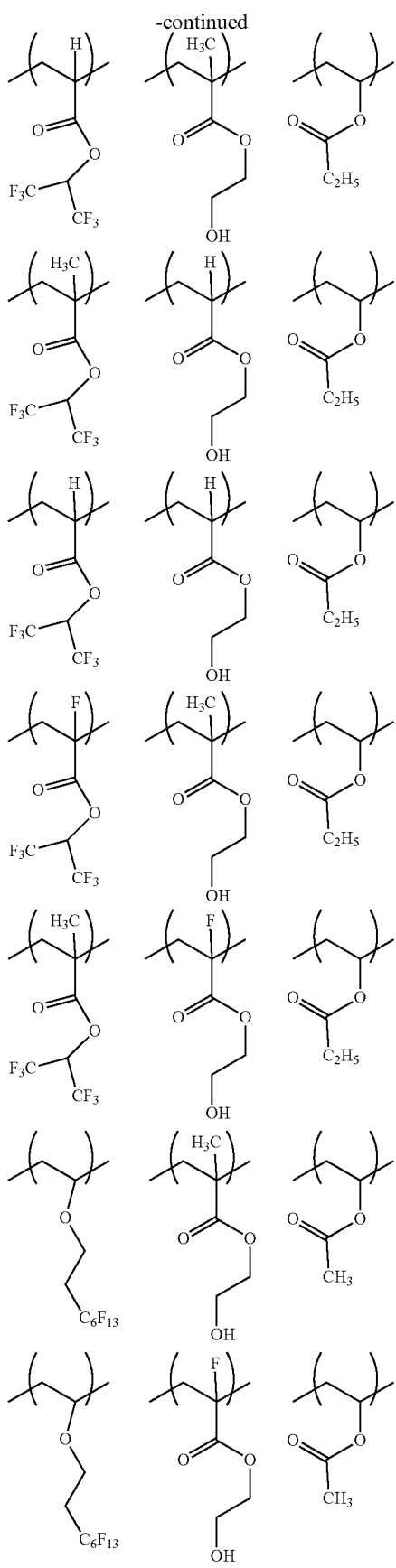

In the fluorine-containing copolymer, preferably, Q is a C3-C10 fluoroalkyl group and X is a carbonyl group (—C(=O)—) in the repeating unit represented by the formula (A), Y is a p-phenylene group (—C$_6$H$_4$—), a p-phenylene carbonyl group (—C$_6$H$_4$—C(=O)—), or a p-phenylene hexafluoroisopropylene group (—C$_6$H$_4$—C(CF$_3$)$_2$—) in the repeating unit represented by the formula (B), and R$^3$ is a hydrogen atom or a methyl group and Z is a bis(trifluoromethyl)vinyl group (—CH=C(CF$_3$)$_2$) in the repeating unit represented by the formula (C).

Preferred combinations of the repeating unit (A), the repeating unit (B), and the repeating unit (C) are listed below.

[Chem. 11]

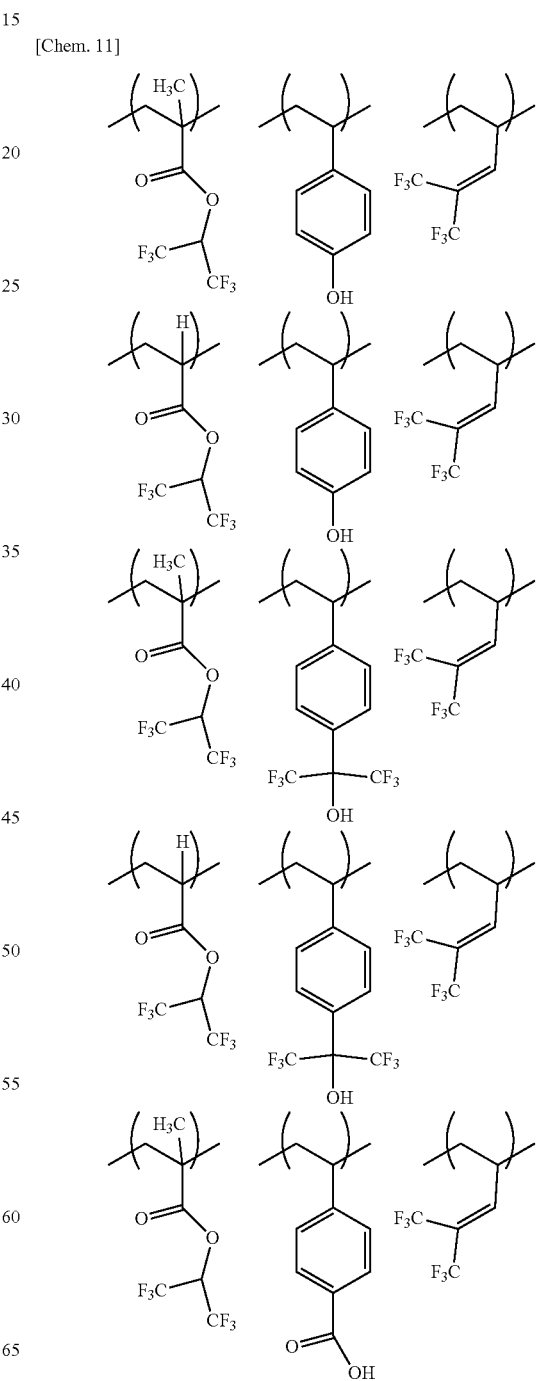

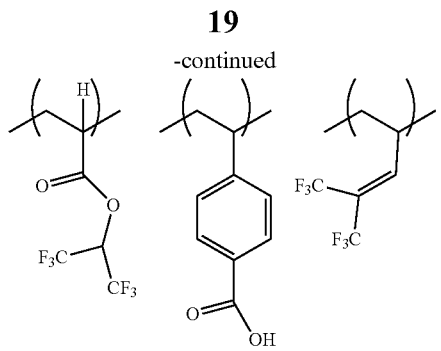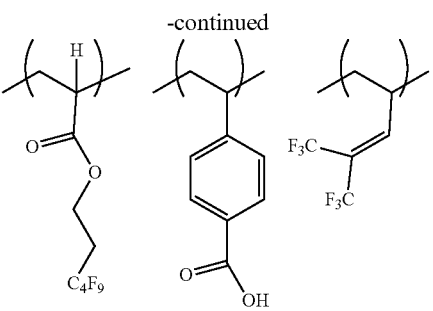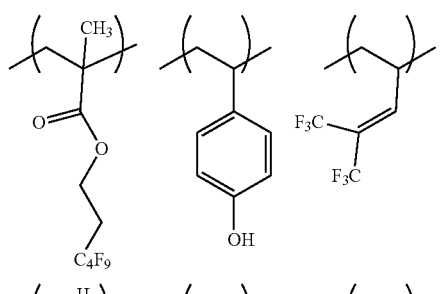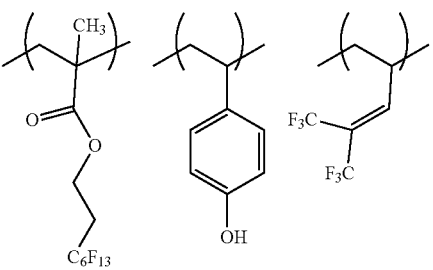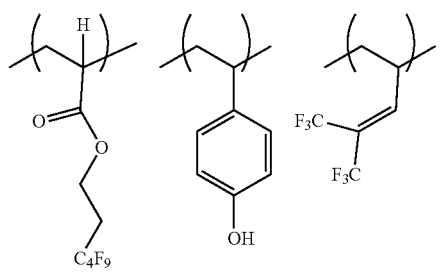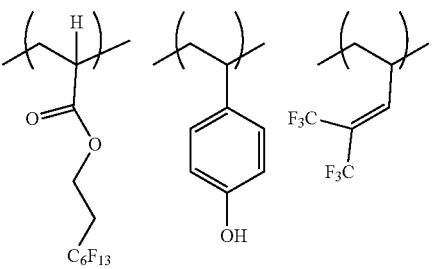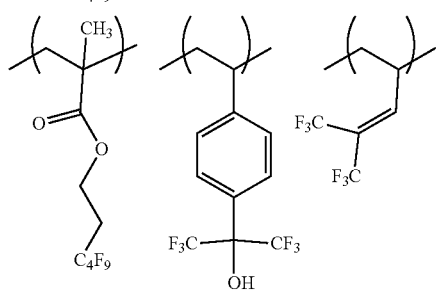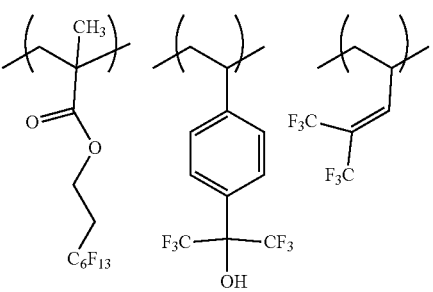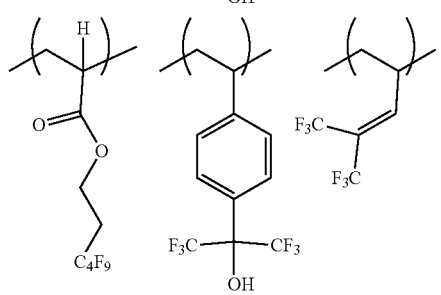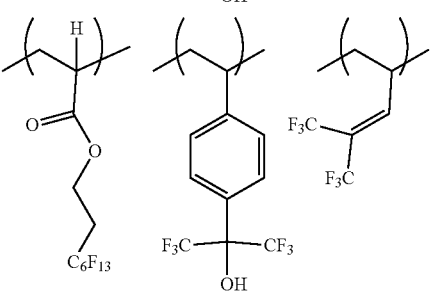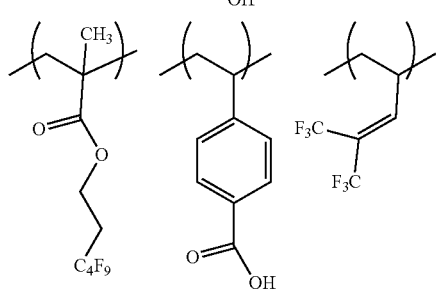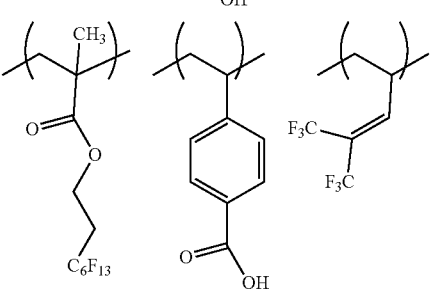

-continued

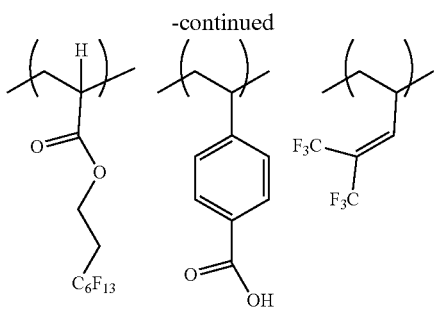
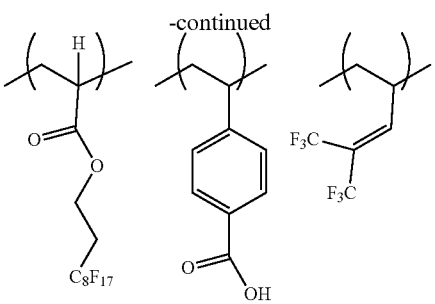

[Chem. 14]

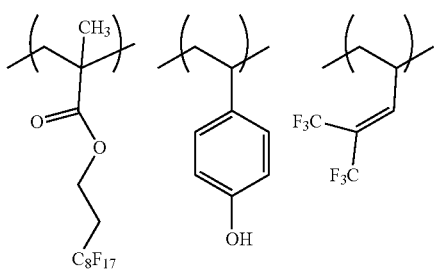

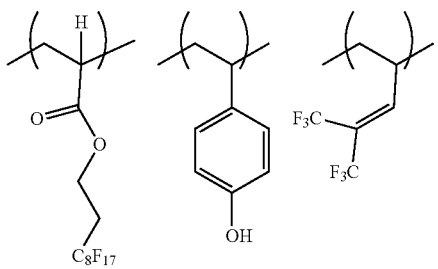

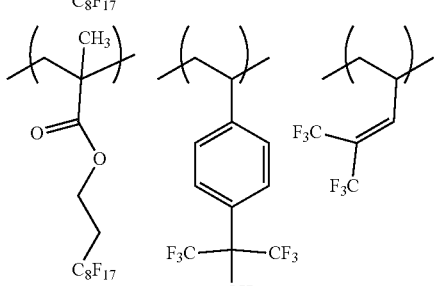

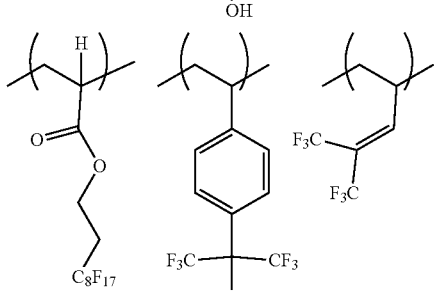

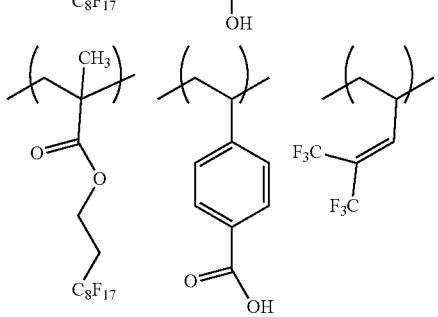

<Repeating Unit Content>

The repeating unit (A) content in terms of mol % relative to the sum of the repeating units (A), (B), and (C) in the fluorine-containing copolymer is preferably 5% or higher but 80% or lower, more preferably 10% or higher but 60% or lower.

The repeating unit (B) content in terms of mol % relative to the sum of the repeating units (A), (B), and (C) in the fluorine-containing copolymer is preferably 10% or higher but 85% or lower, more preferably 20% or higher but 70% or lower.

The repeating unit (C) content in terms of mol % relative to the sum of the repeating units (A), (B), and (C) in the fluorine-containing copolymer is preferably 3% or higher but 90% or lower, more preferably 5% or higher but 80% or lower.

The fluorine-containing copolymer may contain a repeating unit other than the repeating units (A), (B), and (C) as needed for the purpose of improving the solubility in an organic solvent or adhesiveness to a substrate or hardness when formed into a film. The repeating unit content other than the repeating units (A), (B), and (C) relative to the sum of the repeating units (A), (B), and (C) is preferably 50% or lower, more preferably 30% or lower. The repeating unit content other than the repeating units (A), (B), and (C) of higher than 50% tends to fail to achieve the lyophobicity.

[Molecular Weight of Fluorine-Containing Copolymer]

In the production method of a substrate with a patterned film of the present disclosure, the number average molecular weight Mn of the fluorine-containing copolymer contained in the patterned film is preferably 1,000 or more but 100,000 or less, more preferably 3,000 or more but 60,000 or less. The molecular weight dispersion Mw/Mn defined as the ratio between the number average molecular weight Mn and the weight average molecular weight Mw is preferably 1 or more but 4 or less, more preferably 1 or more but 2.5 or less.

The fluorine-containing copolymer having a number average molecular weight Mn of 1,000 or more is preferred as it allows the patterned film containing the fluorine-containing copolymer to have an appropriate hardness and facilitates formation of a film having a desired thickness. In addition, such a fluorine-containing copolymer is also preferred from the standpoint of the durability of the pattern as it facilitates formation of a fine pattern including a lyophobic part and a lyophilic part. The fluorine-containing copolymer having a number average molecular weight Mn of 100,000 or less is preferred as it is easily dissolved in a solvent upon preparation of a composition for forming a pattern containing the fluorine-containing copolymer on a substrate, the obtained composition is easily applicable, and the resulting film is not likely to suffer cracks.

The number average molecular weight Mn and weight average molecular weight Mw of the polymer are measured using a high-performance gel permeation chromatography system (hereafter, also referred to as GPC, produced by Tosoh Corporation, type: HLC-8320GPC), an ALPHA-M column and an ALPHA-2500 column (both produced by Tosoh Corporation) connected in series, and tetrahydrofuran (THF) as a developing solvent. The detector used is a differential refractometer.

3. Repeating Unit

Hereinbelow, the repeating unit (A), repeating unit (B), and repeating unit (C) contained in the fluorine-containing copolymer are described.

[Repeating Unit (A)]

[Chem. 15]

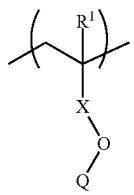

(A)

(In the formula, $R^1$ is a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X is a single bond or a divalent group; and O is an oxygen atom.)

Examples of $R^1$ include a hydrogen atom, a methyl group, an ethyl group, a propyl group, an isopropyl group, a butyl group, an isobutyl group, a tert-butyl group, a fluorine atom, a trifluoromethyl group, a trifluoroethyl group, a trifluoropropyl group, a 1,1,1,3,3,3-hexafluoroisopropyl group (—C(CF$_3$)$_2$H), and a heptafluoroisopropyl group. $R^1$ is particularly preferably a hydrogen atom, a fluorine atom, or a methyl group.

Q is preferably a C3-C10 fluoroalkyl group, and examples thereof include a trifluoromethyl group, a trifluoroethyl group, a trifluoropropyl group, a 1,1,1,3,3,3-hexafluoroisopropyl group (—C(CF$_3$)$_2$H), a heptafluoroisopropyl group, a pentafluoropropyl group, a perfluorobutylethyl group, a perfluorohexylethyl group, a perfluorooctylethyl group, a 1,2,2,3,3,4,4,5-octafluorocyclopentylmethyl group, a perfluorocyclopentyl group, a perfluorocyclohexyl group, and a perfluoroadamanthyl group. Q is particularly preferably a perfluorohexylethyl group or a hexafluoroisopropyl group.

X is a single bond or a divalent group, and a hydrogen atom contained in the divalent group may be replaced by a fluorine atom. The divalent group is preferably a C2-C10 divalent group. Examples thereof include a methylene group, a C2-C10 alkylene group, a C2-C10 alkenylene group, a C6-C10 divalent aryl group, and a C4-C10 divalent alicyclic hydrocarbon group. The alkylene or alkenylene group may contain an ether bond (—O—), a carbonyl group (—C(=O)—), a carboxyl group (—C(=O)—O—), or an oxycarbonyl group (—O—C(=O)—). Since the divalent group having a long aliphatic chain lowers the lyophobicity, X is more preferably a single bond, a carbonyl group (—C(=O)—), an oxyethylene group (—O—CH$_2$—CH$_2$—), a carboxyethylene group (—C(=O)—O—CH$_2$—CH$_2$—), a carboxyphenylene group (—C(=O)—O—C$_6$H$_4$—), a phenylene group (—C$_6$H$_4$—), or a phenylene hexafluoroisopropylene group (—C$_6$H$_4$—C(CF$_3$)$_2$—). X is particularly preferably a carbonyl group.

The repeating unit (A) also preferably has a structure represented by the following formula (A-1).

[Chem. 16]

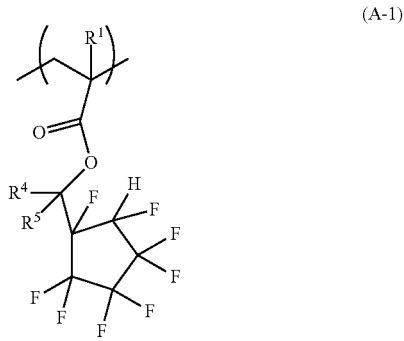

(A-1)

(In the formula (A-1), $R^4$ and $R^5$ are each independently a hydrogen atom, a fluorine atom, or a C1-C3 alkyl group in which hydrogen atoms bonded to a carbon atom are optionally partly or entirely replaced by fluorine atoms; O is an oxygen atom; H is a hydrogen atom; and F is a fluorine atom.)

[Repeating Unit (B)]

[Chem. 17]

(B)

(In the formula, $R^2$ is a hydrogen atom, a fluorine atom, or a C1-C20 alkyl group in which hydrogen atoms bonded to a carbon atom are optionally partly or entirely replaced by fluorine atoms; Y is a single bond or a divalent group; O is an oxygen atom; and H is a hydrogen atom.)

$R^2$ is preferably a hydrogen atom, a methyl group, an ethyl group, a propyl group, an isopropyl group, a butyl group, an isobutyl group, a tert-butyl group, a fluorine atom, a trifluoromethyl group, a trifluoroethyl group, a trifluoropropyl group, a 1,1,1,3,3,3-hexafluoroisopropyl group (—C(CF$_3$)$_2$H), or a heptafluoroisopropyl group. $R^2$ is particularly preferably a hydrogen atom, a fluorine atom, or a methyl group.

Y is a single bond or a divalent group. The divalent group is preferably a C2-C10 divalent group, and examples thereof include a methylene group, a C2-C10 alkylene group, a C2-C10 alkenylene group, a C6-C10 arylene group, and a C4-C10 divalent alicyclic hydrocarbon group. The alkylene or alkenylene group may contain an ether bond (—O—), a carbonyl group (—C(=O)—), a carboxyl group (—C(=O)—O—), or an oxycarbonyl group (—O—C(=O)—). Since the divalent group having a long aliphatic chain lowers the lyophobicity, Y is preferably a single bond, a carbonyl group (—C(=O)—), an oxyethylene group (—O—CH$_2$—CH$_2$—), a carboxyethylene group (—C(=O)—O—CH$_2$—CH$_2$—), a carboxyphenylene group (—C(=O)—O—C$_6$H$_4$—), a phenylene group (—C$_6$H$_4$—), or a phenylene hexafluoroisopropylene group (—C$_6$H$_4$—C(CF$_3$)$_2$—). Particularly preferred is a p-phenylene group or a carboxyethylene group.

[Repeating Unit (C)]

[Chem. 18]

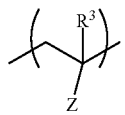

(C)

(In the formula, $R^3$ is a hydrogen atom, a fluorine atom, or a C1-C20 alkyl group in which hydrogen atoms bonded to a carbon atom are optionally partly or entirely replaced by fluorine atoms; and Z is a C1-C20 alkyl group, a C2-C20 alkenyl group, a C2-C20 alkynyl group, a C6-C20 phenyl group, a C1-C20 alkoxy group, or a C1-C20 alkyl carbonyloxy group or carboxyl group, and a hydrogen atom in any of the foregoing groups is optionally replaced by a fluorine atom, an oxygen atom, or a nitrogen atom.)

$R^3$ is preferably a hydrogen atom, a methyl group, an ethyl group, a propyl group, an isopropyl group, a butyl group, an isobutyl group, a tert-butyl group, a fluorine atom, a trifluoromethyl group, a trifluoroethyl group, a trifluoropropyl group, a 1,1,1,3,3,3-hexafluoroisopropyl group (—C(CF$_3$)$_2$H), or a heptafluoroisopropyl group. $R^3$ is particularly preferably a hydrogen atom, a fluorine atom, or a methyl group.

Z is a C1-C20 alkyl group, a C2-C20 alkenyl group, a C2-C20 alkynyl group, a C6-C20 phenyl group, a C1-C20 alkoxy group, or a C1-C20 alkyl carbonyloxy group or carboxyl group, and a hydrogen atom in any of the foregoing groups is optionally replaced by a fluorine atom, an oxygen atom, or a nitrogen atom. For obtaining a high effect of recovering lyophobicity by heating, Z is particularly preferably a bis(trifluoromethyl)vinyl group (—CH=C(CF$_3$)$_2$).

4. Synthesis of Fluorine-Containing Copolymer 4-1. Monomer

Hereinbelow, a monomer (A1) providing a repeating unit (A), a monomer (B1) providing a repeating unit (B), and a monomer (C1) providing a repeating unit (C) are mentioned.

A fluorine-containing copolymer containing both a repeating unit (A) and a repeating unit (C) is obtainable by copolymerization of a monomer (A1) and a monomer (C1). A fluorine-containing copolymer containing all of a repeating unit (A), a repeating unit (B), and a repeating unit (C) is obtainable by copolymerization of a monomer (A1), a monomer (B1), and a monomer (C1).

[Monomer (A1)]

[Chem. 19]

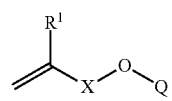

(A1)

($R^1$, X, and Q are each the same as defined for the formula (A).)

[Monomer (B1)]

[Chem. 20]

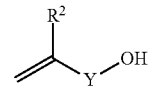

(B1)

($R^2$ and Y are each the same as defined for the formula (B).)

Examples of the monomer (B1) include the following monomers. As described above, $R^2$ is particularly preferably a hydrogen atom, a fluorine atom, or a methyl group.

[Chem. 21]

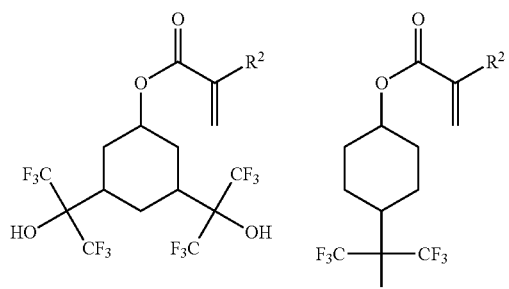

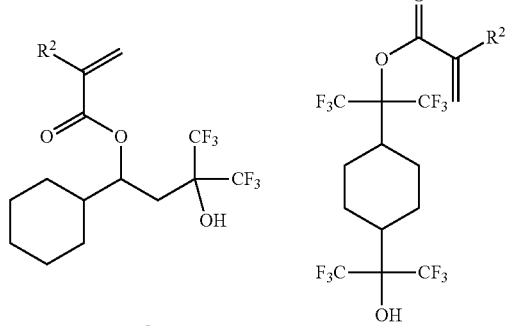

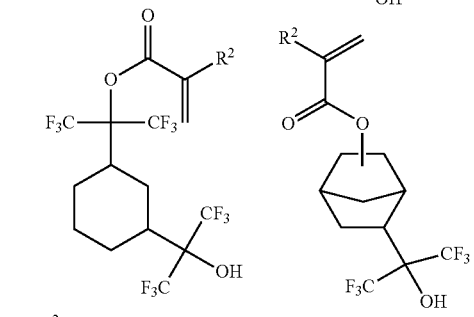

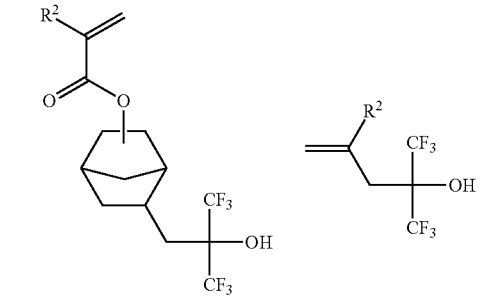

-continued

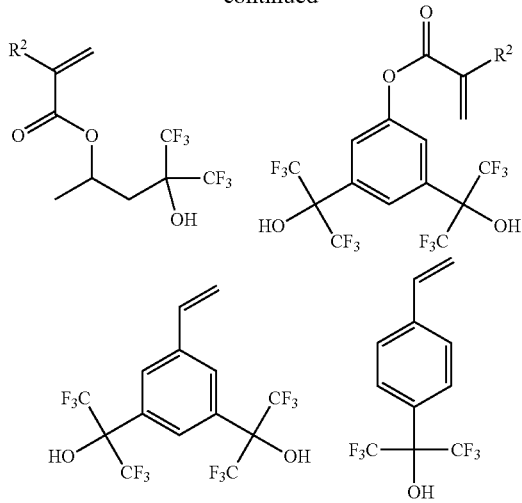

[Monomer (C1)]

[Chem. 22]

($R^3$ and Z are each the same as defined for the formula (C).)

4-2. Synthesis Method of Fluorine-Containing Copolymer

A fluorine-containing copolymer can be synthesized by a common polymerization method using the monomers (A1), (B1), and (C1) as raw materials. Preferred are radical polymerization and ion polymerization. In some cases, coordinated anionic polymerization, living anionic polymerization, or cationic polymerization may be selected. A polymerization solvent may be used in the polymerization. Hereinbelow, radical polymerization is described.

Radical polymerization can be carried out in the presence of a radical polymerization initiator or a radical polymerization initiating source by a known polymerization method such as bulk polymerization, solution polymerization, suspension polymerization, or emulsion polymerization by batch operation, semi-continuous operation, or continuous operation.

<Radical Polymerization Initiator>

Examples of the radical polymerization initiator include azo compounds, peroxide compounds, and redox compounds. Examples of the azo compounds include azobisisobutyronitrile. Examples of the peroxide compounds include t-butyl peroxypivalate, di-t-butyl peroxide, i-butyryl peroxide, lauroyl peroxide, succinic peroxide, dicinnamyl peroxide, di-n-propyl peroxydicarbonate, t-butyl peroxyallyl monocarbonate, benzoyl peroxide, hydrogen peroxide, and ammonium persulfate. The redox compound may be a compound obtained by combining an oxidant and a reducing agent. Examples thereof include a compound obtained by combining hydrogen peroxide water with a divalent iron ion (Fenton's reagent).

<Polymerization Solvent>

The polymerization solvent is preferably those not inhibiting radical polymerization, and examples thereof include ester solvents, ketone solvents, hydrocarbon solvents, and alcohol solvents. Also usable are water, ether solvents, cyclic ether solvents, freon solvents, and aromatic solvents.

Specific examples of the polymerization solvent include ethyl acetate and n-butyl acetate as the ester solvents, acetone and methyl isobutyl ketone as the ketone solvents, toluene and cyclohexane as the hydrocarbon solvents, and methanol, isopropyl alcohol, and ethylene glycol monomethyl ether as the alcohol solvents.

Each of these polymerization solvents may be used alone, or in admixture of two or more. A molecular weight modifier such as mercaptan may be used together.

<Polymerization Condition>

The polymerization temperature may be appropriately determined in accordance with the type of the radical polymerization initiator or the radical polymerization initiating source. The radical polymerization initiator or the radical polymerization initiating source is preferably selected as appropriate so that the polymerization temperature is set to, for example, 20° C. or higher but 200° C. or lower, preferably 30° C. or higher but 140° C. or lower. The molecular weight of the fluorine-containing copolymer can be controlled by the type of the radical polymerization initiator or the radical polymerization initiating source and adjustment of the polymerization conditions.

The polymerization solvent such as an organic solvent or water is removed from the solution or dispersion containing the fluorine-containing copolymer after polymerization by a known method such as reprecipitation, filtration, or distillation under reduced pressure.

In the case of using the fluorine-containing copolymer as a resist component, the solubility of the fluorine-containing copolymer in a developing solution varies in accordance with the molecular weight of the fluorine-containing copolymer, which may change the patterning conditions in lithography. A larger molecular weight of the fluorine-containing copolymer tends to lower the dissolution speed thereof in a developing solution and a smaller molecular weight of the fluorine-containing copolymer tends to increase the dissolution speed. The molecular weight of the fluorine-containing copolymer can be controlled by adjusting the polymerization conditions.

5. Composition for Forming a Resist Pattern

The fluorine-containing copolymer is blended with a photosensitizer or acid generating agent, a basic compound, and a solvent to obtain a composition for forming a resist pattern. The obtained composition for forming a resist pattern is applied to a substrate, followed by patterning by lithography. Thus, a substrate with a patterned film used in the production method of a substrate with a patterned film of the present disclosure can be obtained. Hereinbelow, the composition for forming a resist pattern is also simply referred to as a resist.

The resist essentially contains a fluorine-containing copolymer (a), and contains as needed an alkali-soluble resin (b), a naphthoquinonediazide group-containing compound (c), a solvent (d), a photoacid generator (e), a basic compound (f), and a crosslinking agent (g).

5-1. Alkali-Soluble Resin (b)

Examples of the alkali-soluble resin (b) include an alkali-soluble novolak resin. The alkali-soluble novolak resin can be obtained by condensation of a phenol compound and an aldehyde in the presence of an acid catalyst.

<Phenol Compound>

Examples of the phenol compound include phenol, o-cresol, m-cresol, p-cresol, 2,3-dimethyl phenol, 2,4-dimethyl phenol, 2,5-dimethyl phenol, 3,4-dimethyl phenol, 3,5-dimethyl phenol, 2,3,5-trimethyl phenol, 3,4,5-trimethyl phenol, resorcinol, 2-methyl resorcinol, 4-ethyl resorcinol, hydroquinone, methyl hydroquinone, catechol, 4-methylcatechol, pyrogallol, phloroglucinol, thymol, and isothymol. Each of these phenol compounds may be used alone or in combination of two or more.

<Aldehyde>

Examples of the aldehyde include formaldehyde, trioxane, paraformaldehyde, benzaldehyde, acetaldehyde, propyl aldehyde, phenyl acetaldehyde, α-phenyl propyl aldehyde, β-phenyl propyl aldehyde, o-hydroxybenzaldehyde, m-hydroxybenzaldehyde, p-hydroxybenzaldehyde, o-methylbenzaldehyde, m-methylbenzaldehyde, p-methylbenzaldehyde, nitrobenzaldehyde, furfural, glyoxal, glutaraldehyde, terephthalaldehyde, and isophthalaldehyde.

<Acid Catalyst>

Examples of the acid catalyst include hydrochloric acid, nitric acid, sulfuric acid, phosphoric acid, phosphorous acid, formic acid, oxalic acid, acetic acid, methanesulfonic acid, diethyl sulfuric acid, and p-toluene sulfonic acid. Each of these acid catalysts may be used alone or in combination of two or more thereof.

The mass average molecular weight of the alkali-soluble resin (b) component is preferably 1,000 to 50,000 from the standpoint of the developability and resolution of the positive resist composition.

5-2. Naphthoquinonediazide Group-Containing Compound (c)

The naphthoquinonediazide group-containing compound (c) is not limited, and those used as a photosensitive element of an i-line resist composition. Examples thereof include a naphthoquinone-1,2-diazide sulfonic acid ester compound, ortho-benzoquinonediazide sulfonic acid ester, ortho-anthraquinonediazide sulfonic acid ester, an ester compound of a naphthoquinone-1,2-diazide sulfonyl halide and a hydroxy compound. Examples of the naphthoquinone-1,2-diazide sulfonyl halide include naphthoquinone-1,2-diazide-5-sulfonyl chloride, naphthoquinone-1,2-diazide-4-sulfonyl chloride, and naphthoquinone-1,2-diazide-6-sulfonyl chloride.

The naphthoquinonediazide group-containing compound (c) is preferably naphthoquinonediazide-4-sulfonic acid ester, naphthoquinonediazide-5-sulfonic acid ester, or naphthoquinonediazide-6-sulfonic acid ester for its excellent solubility. Each of these compounds may be used alone or in admixture of two or more thereof.

The amount of the naphthoquinonediazide group-containing compound (c) is preferably 10% by mass or more but 60% by mass or less, more preferably 20% by mass or more but 50% by mass or less, relative to the total mass of the alkali soluble resin (b) and the naphthoquinonediazide group-containing compound (c). If the amount is more than 60% by mass, the resulting composition fails to have sensitivity as a resist. If the amount is less than 10% by mass, a fine pattern is not likely to be obtained due to factors such as film reduction in an unexposed part after photolithography.

5-3. Solvent (d)

The solvent (d) contained in the resist may be selected from known solvents for a resist which can dissolve the fluorine-containing copolymer (a), the alkali soluble resin (b), and the naphthoquinonediazide group-containing compound (c) to provide a homogeneous solution. Two or more solvents may be used in admixture.

Examples of such a solvent include ketones, alcohols, polyhydric alcohols, esters, aromatic solvents, ethers, and fluorine solvents. The examples further include high-boiling-point solvents with an aim of improving the applicability, such as turpentine-based petroleum naphtha solvents and paraffin-based solvents.

Examples of the ketones include acetone, methyl ethyl ketone, cyclopentanone, cyclohexanone, methyl isobutyl ketone, methyl isopentyl ketone, and 2-heptanone. Examples of the alcohols include isopropanol, butanol, isobutanol, n-pentanol, isopentanol, tert-pentanol, 4-methyl-2-pentanol, 3-methyl-3-pentanol, 2,3-dimethyl-2-pentanol, n-hexanol, n-heptanol, 2-heptanol, n-octanol, n-decanol, s-amylalcohol, t-amylalcohol, isoamylalcohol, 2-ethyl-1-butanol, lauryl alcohol, hexyl decanol, and oleyl alcohol. Examples of the polyhydric alcohols include ethylene glycol, diethylene glycol, propylene glycol, dipropylene glycol, ethylene glycol monoacetate, ethylene glycol dimethyl ether (EDC), diethylene glycol monoacetate, propylene glycol monoacetate, dipropylene glycol monoacetate, propylene glycol monoethyl ether, propylene glycol monopropyl ether, propylene glycol monobutyl ether, propylene glycol monomethyl ether acetate (PGMEA) and propylene glycol monomethyl ether (PGME), and derivatives of these polyhydric alcohols. Examples of the esters include methyl lactate, ethyl lactate (EL), methyl acetate, ethyl acetate, butyl acetate, methyl pyruvate, ethyl pyruvate, methyl methoxypropionate, ethyl ethoxypropionate, and γ-butyrolactone (GBL). Examples of the aromatic solvents include toluene and xylene. Examples of the ethers include diethyl ether, dioxane, anisole, and diisopropylether. Examples of the fluorine solvents include hexafluoroisopropyl alcohol.

The solvent is preferably ethylene glycol dimethyl ether (EDC), propylene glycol monomethyl ether acetate (PGMEA), propylene glycol monomethyl ether (PGME), cyclohexanone, ethyl lactate (EL), or γ-butyrolactone (GBL).

With regard to the amount of the solvent (d) contained in the resist, the resist preferably has a solid content of 1% by mass or higher but 25% by mass or lower, more preferably 5% by mass or higher but 15% by mass or lower. Adjustment of the solid content of the resist can control the thickness of the resin film to be formed.

5-4. Photoacid Generator (e)

The photoacid generator (e) may be any compound that is used as an acid generator for a chemically amplified resist. Examples thereof include sulfonates and sulfonic acid esters.

Examples of the sulfonates include iodonium sulfonate, sulfonium sulfonate, N-imide sulfonate, N-oxime sulfonate, o-nitrobenzyl sulfonate, tris(methane) sulfonate of pyrogallol, triphenyl sulfonium trifluoromethane sulfonate, and triphenyl sulfonium perfluoro-n-butane sulfonate.

During the exposure in photolithography, these photoacid generators generate alkanesulfonic acid, arylsulfonic acid, or partially- or completely fluorinated arylsulfonic acid or alkanesulfonic acid. The photoacid generator generating completely fluorinated alkanesulfonic acid is preferred. Preferred examples thereof include triphenyl sulfonium trifluoromethane sulfonate and triphenyl sulfonium perfluoro-n-butane sulfonate.

5-5. Basic Compound (f)

The basic compound (f) has an effect of lowering the diffusion rate of the acid generated by the photoacid generator (e) in the resist film. Addition of the basic compound (f) is expected to improve the shape of the resist pattern by adjusting the acid diffusion distance and to improve the stability of imparting the resist pattern having a desired accuracy even when the time elapsed from formation of the resist film to exposure is long.

Examples of such a basic compound include aliphatic amines, aromatic amines, heterocyclic amines, and aliphatic polycyclic amines. Preferred are secondary or tertiary aliphatic amines and alkyl alcohol amines. Examples of such amines include trimethylamine, triethylamine, tripropylamine, tributylamine, tripentylamine, trihexylamine, triheptylamine, trioctylamine, trinonylamine, tridecylamine, tridodecylamine, dimethylamine, diethylamine, dipropylamine, dibutylamine, dipentylamine, dihexylamine, diheptylamine, dioctylamine, dinonylamine, didecylamine, didodecylamine, dicyclohexylamine, methylamine, ethylamine, propylamine, butylamine, pentylamine, hexylamine, heptylamine, octylamine, nonylamine, decylamine, dodecylamine, diethanolamine, triethanolamine, diisopropanolamine, triisopropanolamine, dioctanolamine, trioctanolamine, aniline, pyridine, picoline, lutidine, bipyridine, pyrrole, piperidine, piperazine, indole, and hexamethylenetetramine. Each of these basic compounds may be used alone or in combination of two or more.

The amount of the basic compound (f) in the resist is preferably 0.001 to 2 parts by mass, more preferably 0.01 to 1 part by mass, relative to 100 parts by mass of the fluorine-containing copolymer (a). The basic compound (f) in an amount of less than 0.001 parts by mass fails to sufficiently provide an effect as an additive. The basic compound (f) in an amount of more than 2 parts by mass may lower the resolution property and sensitivity.

5-6. Crosslinking Agent (g)

The resist may contain a crosslinking agent (g) as needed. A known agent may be used as the crosslinking agent (g). Examples of the crosslinking agents include 2,4,6-tris[bis(methoxymethyl)amino]-1,3,5-triazine (methylol melamine curing agent) and its derivatives, 1,3,4,6-tetrakis(methoxymethyl)glycoluril (glycoluril curing agent) and its derivatives, polyfunctional epoxy compounds, polyfunctional oxetane compounds, and polyfunctional isocyanate compounds. Multiple types of crosslinking agents may be used.

6. Formation of Pattern

Formation of a pattern in the production method of a substrate with a patterned film of the present disclosure is described. Formation of a pattern includes: a film-forming step in which the resist is applied onto a substrate to form a film; an exposure step in which the film is exposed to an electron magnetic wave or electron beam having a wavelength of 600 nm or shorter through a photomask so that the photomask pattern is transferred to the film; and a development step in which the film is developed using a developing solution to obtain a pattern.

A pattern can be formed using a resist containing a fluorine-containing copolymer, through a film-forming step (a) in which the resist is applied onto a substrate to form a resist film; an exposure step (b) in which the resist film is heated and then exposed to an electron magnetic wave or electron beam having a wavelength of 600 nm or shorter through a patterned photomask; and a development step (c) in which the exposed resist film is developed using an alkali developing solution or an organic solvent to obtain a resist pattern that is a pattern transferred from the photomask on the substrate.

Hereinbelow, each step is described with reference to examples.

6-1. Film-Forming Step (a)

In the film-forming step (a), the resist containing a fluorine-containing copolymer is applied to a substrate such as a silicon wafer by spin coating, and the silicon wafer is heated on a hot plate at 60° C. or higher but 200° C. or lower for 10 seconds or longer but 10 minutes or shorter, preferably at 80° C. or higher but 150° C. or lower for 30 seconds or longer but two minutes or shorter. Thus, a resist film is formed on the substrate.

The substrate may be, for example, a silicon wafer, a metal substrate, or a glass substrate. An organic or inorganic film may be provided on the substrate. For example, an anti-reflection film or an underlayer of a multilayer resist may be provided, and a pattern may be formed on that film.

6-2. Exposure Step (b)

In the exposure step (b), a photomask is set on an exposure device, and the resist film is irradiated with an electromagnetic wave or an electron beam having a wavelength of 600 nm or shorter to an exposure dose of, for example, 1 mJ/cm$^2$ or more but 200 mJ/cm$^2$ or less, preferably 10 mJ/cm$^2$ or more but 100 mJ/cm$^2$ or less, through the photomask, followed by heating of the resist film on a hot plate at, for example, 60° C. or higher but 150° C. or lower for 10 seconds or longer but five minutes or shorter, preferably at 80° C. or higher but 130° C. or lower for 30 seconds or longer but three minutes or shorter. Thus, the pattern of the photomask is transferred to the resist film.

The electromagnetic wave has a wavelength of preferably 100 to 600 nm, more preferably 300 to 500 nm. In particular, light containing i-line (365 nm), h-line (405 nm), or g-line (436 nm) is preferred. If necessary, light having a wavelength of 330 nm or shorter may be cut off.

The light source may be, for example, KrF excimer laser (wavelength: 248 nm), ArF excimer laser (wavelength: 193 nm), or F2 excimer laser (wavelength: 157 nm).

6-3. Development Step (c)

In the development step (c), either an exposed part or an unexposed part of the resist film is dissolved using a developing solution such as an aqueous solution of tetramethyl ammonium hydroxide (TMAH) at a concentration of, for example, 0.1% by mass or higher but 5% by mass or lower, preferably 2% by mass or higher but 3% by mass or lower, or an organic solvent, thereby forming a pattern. Thus, a patterned film is obtained on the substrate. Examples of the organic solvent include propylene glycol monomethyl ether acetate (PGMEA) and butyl acetate. In the development step, a substrate with a patterned film having a target pattern can be obtained by bringing the resist film into contact with the developing solution, for example, for 10 seconds or longer but three minutes or shorter, preferably 30 seconds or longer but two minutes or shorter, by a known method such as dipping, puddling, or spraying.

EXAMPLES

The production method of a substrate with a patterned film and the fluorine-containing copolymer of the present disclosure are specifically described based on the following examples. The present invention is not intended to be limited to the following examples.

1. Synthesis of Monomer

A fluorine-containing monomer for obtaining a fluorine-containing copolymer was synthesized.

1-1. Synthesis of MA-CH2-OFCP

[Synthesis of 1,2,2,3,3,4,4,5-octafluorocyclopentanemethanol]

In nitrogen atmosphere, a 300-ml stainless steel pressure-resistant container was charged with 31.5 ml (0.75 mol) of methanol, 1.11 g (0.0045 mol) of benzoyl peroxide (BPO), and 31.2 g (0.12 mol) of octafluorocyclopentene (produced by Central Glass Co., Ltd.) at room temperature (20° C.: the same applies hereinafter) and sealed. The contents were heated to 120° C. and then stirred for 24 hours, followed by the reaction below. After cooling of the container, the contents were subjected to atmospheric distillation, whereby 28.8 g of 1,2,2,3,3,4,4,5-octafluorocyclopentanemethanol was obtained at a yield of 80%.

[Chem. 23]

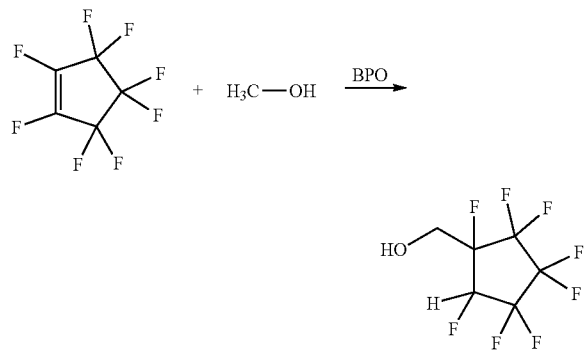

The results of nuclear magnetic resonance (NMR) analysis are shown below.

<NMR Analysis Results>

$^{1}$H-NMR (CDCl$_3$, TMS reference)

δ (ppm): 4.21-4.05 (2H, m), 5.22 (1H, m).

[Synthesis of MA-CH2-OFCP]

To a 300-ml glass flask equipped with a stirrer were collected 24.3 g (0.1 mol) of 1,2,2,3,3,4,4,5-octafluorocyclopentanemethanol obtained in the above synthesis, 15.1 g (0.15 mol) of triethylamine, and methoxyphenol (1000 ppm) as a polymerization inhibitor. To the reaction system was added dropwise 16.9 g (0.11 mol) of methacrylic acid anhydride at 30° C., followed by stirring for two hours. After the stirring, 40 ml of diisopropylether and 30 ml of pure water were added to the system, followed by separation. Then, 20 ml of 1% by mass aqueous sodium hydroxide was added, stirred for one hour, and transferred to a separatory funnel. Thus, an organic layer was obtained. The organic layer was washed twice using 30 ml of pure water, and subjected to distillation under reduced pressure at a pressure of 1.0 kPa and a temperature of 70° C. to 72° C., whereby 26.5 g of MA-CH2-OFCP shown below was obtained at a yield of 85%.

[Chem. 24]

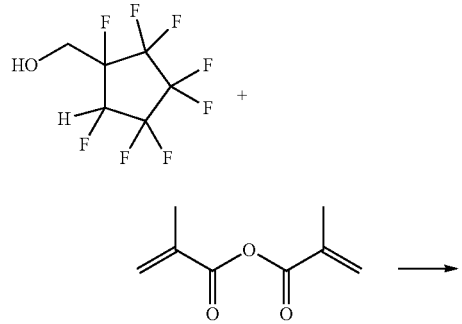

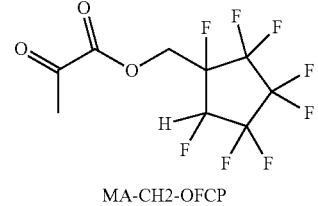

MA-CH2-OFCP

<NMR Analysis Results>

$^{1}$H-NMR (solvent: deuterochloroform, reference material: TMS), δ (ppm): 1.92 (3H, s), 4.21-4.05 (2H, m), 5.22 (1H, m), 5.65 (1H, q), 6.12 (1H, q).

1-2. Synthesis of 1,1-bis(trifluoromethyl)butadiene (BTFBE)

An amount of 400 g of concentrated sulfuric acid in a 1000-ml glass flask equipped with a stirrer was heated to 100° C., and 300 g of 1,1,1-trifluoro-2-trifluoromethyl-4-penten-2-ol was gradually added dropwise thereto over one hour to cause the following reaction. After addition of sodium hydrogen carbonate to the reaction system, a fraction at 68° C. to 70° C. was recovered by atmospheric distillation, whereby 1,1-bis(trifluoromethyl)butadiene (BTFBE) was obtained at a yield of 58%.

[Chem. 25]

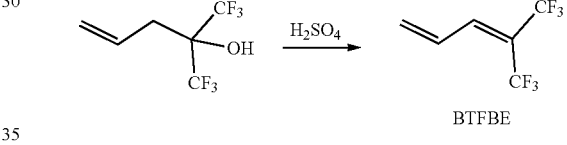

<NMR Analysis Results>

$^{1}$H-NMR (solvent: deuterochloroform, reference material: TMS), δ (ppm): 5.95 (1H, dd), 6.05 (1H, dd), 6.85 (1H, m), 7.04 (1H, m).

$^{19}$F-NMR (solvent: deuterochloroform, reference material: C$_6$D$_6$), δ (ppm): −58.4 (3F, m), −65.3 (3F, m)

2. Synthesis of Polymer

[Measurement of Molar Ratio of Repeating Units] NMR

The molar ratio of the repeating units in the polymer was determined from the measurement values of $^{1}$H-NMR and $^{19}$F-NMR by NMR.

[Measurement of Molecular Weight of Polymer] GPC

The number average molecular weight Mn and the weight average molecular weight Mw of the polymer were measured using a high-performance gel permeation chromatography system (produced by Tosoh Corporation, type: HLC-8320GPC), an ALPHA-M column and an ALPHA-2500 column (both produced by Tosoh Corporation) connected in series, and tetrahydrofuran (THF) as a developing solvent. The detector used was a differential refractometer. The molecular weight dispersion Mw/Mn was calculated based on the number average molecular weight Mn and the weight average molecular weight Mw.

2-1. Synthesis of Fluorine-Containing Copolymer 1

To a 300-ml glass flask equipped with a stirrer were collected 43.2 g (0.1 mol) of 2-(perfluorohexyl)ethyl methacrylate (MA-C6F), 19.0 g (0.1 mol) of BTFBE, and 62 g of THF as a solvent at room temperature, and 0.8 g (0.005 mol) of α,α'-azobisisobutyronitrile (AIBN) as a polymerization initiator was further added, followed by deaeration with stirring. After purging the atmosphere inside the flask with nitrogen gas, the contents were heated to a temperature of 75° C. and reacted for six hours. After decompression of the reaction system to remove THF, the reaction system was added dropwise to 300 g of n-heptane, whereby a clear viscous substance was precipitated. A supernatant of the viscous substance was separated by decantation. The viscous substance was dried under reduced pressure at a temperature of 60° C., whereby 22 g of a fluorine-containing copolymer 1 in the form of a clear viscous substance was obtained at a yield of 37%.

<NMR Measurement Results>

The content ratio of the repeating units in the fluorine-containing copolymer 1 in terms of the molar ratio was (MA-C6F-derived repeating unit):(BTFBE-derived repeating unit)=28:72.

[Chem. 26]

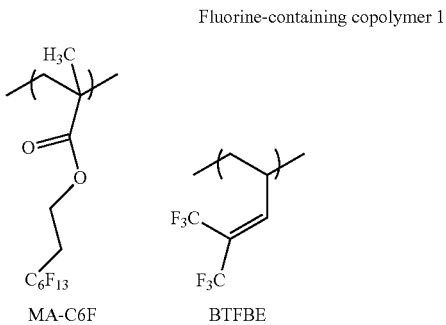

Fluorine-containing copolymer 1

<GPC Measurement Results>
Mw=7,300, Mw/Mn=1.4

2-2. Synthesis of Fluorine-Containing Copolymer 2

To a 300-ml glass flask equipped with a stirrer were collected 43.2 g (0.1 mol) of MA-C6F, 27.0 g (0.1 mol) of 1,1,1,3,3,3-hexafluoro-2-(4-vinylphenyl)propan-2-ol (4-HFA-St), 19.0 g (0.1 mol) of BTFBE, and 90 g of THF at room temperature, and 0.8 g (0.005 mol) of AIBN was further added, followed by deaeration with stirring. After purging the atmosphere inside the flask with nitrogen gas, the contents were heated to a temperature of 75° C. and reacted for six hours. After removal of THF by vacuum concentration of the solution after completion of the reaction, the reaction system was added dropwise to 350 g of n-heptane, whereby a clear viscous substance was precipitated. A supernatant of the viscous substance was separated by decantation. The viscous substance was dried under reduced pressure at a temperature of 60° C., whereby 48 g of a fluorine-containing copolymer 2 in the form of a clear viscous substance was obtained at a yield of 52%.

<NMR Measurement Results>

The content ratio of the repeating units in the fluorine-containing copolymer 2 in terms of the molar ratio was (MA-C6F-derived repeating unit):(4-HFA-St-derived repeating unit):(BTFBE-derived repeating unit)=17:37:46.

[Chem. 27]

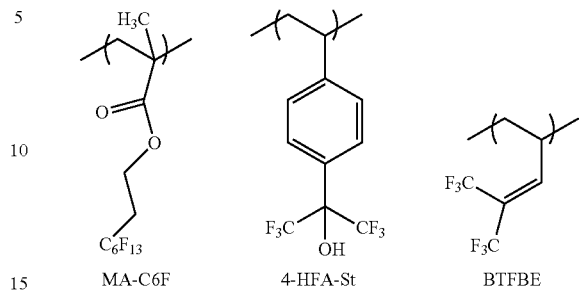

Fluorine-containing copolymer 2

<GPC Measurement Results>
Mw=13,300, Mw/Mn=1.3

2-3. Synthesis of Fluorine-Containing Copolymer 3

To a 300-ml glass flask equipped with a stirrer were collected 43.2 g (0.1 mol) of MA-C6F, 16.2 g (0.1 mol) of p-acetoxystyrene (AcO-St), 19.0 g (0.1 mol) of BTFBE, and 80 g of THF at room temperature, and 0.8 g (0.005 mol) of AIBN was further added, followed by deaeration with stirring. After purging the atmosphere inside the flask with nitrogen gas, the contents were heated to a temperature of 75° C. and reacted for six hours. After decompression of the reaction system to remove THF, 350 g of n-heptane was added dropwise to the reaction system, whereby a clear viscous substance was precipitated. A supernatant of the viscous substance was separated by decantation. The viscous substance was dissolved in 100 g of methanol, and 10.1 g (0.1 mol) of triethylamine (TEA) was added thereto. The solution was heated to 50° C. and stirred for eight hours for solvolysis of an acetoxy group. After elimination of the acetoxy group was confirmed, the solution was concentrated and dried under reduced pressure at a temperature of 60° C., whereby 35 g of a fluorine-containing copolymer 3 in the form of a white solid was obtained at a yield of 55%.

<NMR Measurement Results>

The content ratio of the repeating units in the fluorine-containing copolymer 3 in terms of the molar ratio was (MA-C6F-derived repeating unit):(p-hydroxystyrene (p-HO-St)-derived repeating unit):(BTFBE-derived repeating unit)=12:38:50.

[Chem. 28]

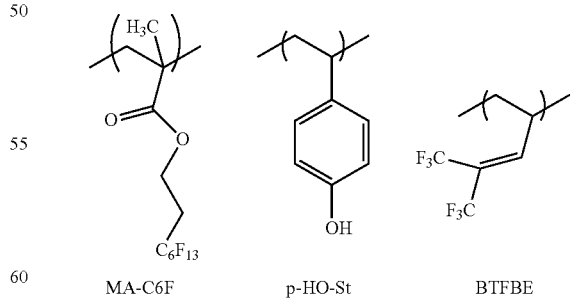

Fluorine-containing copolymer 3

<GPC Measurement Results>
Mw=17,500, Mw/Mn=1.4

2-4. Synthesis of Fluorine-Containing Copolymer 4

A fluorine-containing copolymer 4 containing the following repeating units was synthesized in the same manner as in synthesis of the fluorine-containing copolymer 3 described above, except that MA-C6F used in synthesis of the fluorine-containing copolymer 3 was replaced by hexafluoroisopropyl methacrylate (HFIP-M). The fluorine-containing copolymer 4 was obtained at a yield of 51%.
<NMR Measurement Results>

The content ratio of the repeating units in the fluorine-containing copolymer 4 in terms of the molar ratio was (HFIP-M-derived repeating unit):(p-HO-St-derived repeating unit):(BTFBE-derived repeating unit)=15:39:46.

in synthesis of the fluorine-containing copolymer 3 described above, except that MA-C6F used in synthesis of the fluorine-containing copolymer 3 was replaced by 2-(perfluorohexyl)ethyl vinyl ether (V-C6F). The fluorine-containing copolymer 6 was obtained at a yield of 41%.
<NMR Measurement Results>

The content ratio of the repeating units in the fluorine-containing copolymer 6 in terms of the molar ratio was (V-C6F-derived repeating unit):(p-HO-St-derived repeating unit):(BTFBE-derived repeating unit)=10:38:52.

[Chem. 29]

Fluorine-containing copolymer 4

HFIP-M    p-HO-St    BTFBE

[Chem. 31]

Fluorine-containing copolymer 6

V-C6F    p-HO-St    BTFBE

<GPC Measurement Results>
Mw=15,200, Mw/Mn=1.4

2-5. Synthesis of Fluorine-Containing Copolymer 5

A fluorine-containing copolymer 5 containing the following repeating units was synthesized in the same manner as in synthesis of the fluorine-containing copolymer 3 described above, except that MA-C6F used in synthesis of the fluorine-containing copolymer 3 was replaced by MA-CH2-OFCP. The fluorine-containing copolymer 5 was obtained at a yield of 54%.
<NMR Measurement Results>

The content ratio of the repeating units in the fluorine-containing copolymer 5 in terms of the molar ratio was (MA-CH2-OFCP-derived repeating unit):(p-HO-St-derived repeating unit):(BTFBE-derived repeating unit)=13:38:49.

<GPC Measurement Results>
Mw=11,900, Mw/Mn=1.4

2-7. Synthesis of Fluorine-Containing Copolymer 7

To a 1000-ml glass flask equipped with a stirrer were collected 74.1 g (0.31 mol) of HFIP-M, 16.5 g (0.12 mol) of 2-hydroxyethyl methacrylate (HEMA), 9.5 g (0.11 mol) of vinyl acetate (VAc), and 50 g of butyl acetate at room temperature, and 1.6 g (0.01 mol) of AIBN was further added, followed by deaeration with stirring. After purging the atmosphere inside the flask with nitrogen gas, the contents were heated to 80° C. and reacted for six hours. After decompression of the reaction system to remove butyl acetate, the reaction system was added dropwise to 500 g of n-heptane, whereby a white solid was precipitated. After filtration, the residue was dried under reduced pressure at 60° C., whereby 85.7 g of a fluorine-containing copolymer 7 in the form of a white solid was obtained at a yield of 78%.

<NMR Measurement Results>

The content ratio of the repeating units in the fluorine-containing copolymer 7 in terms of the molar ratio was (HFIP-M-derived repeating unit):(HEMA-derived repeating unit):(VAc-derived repeating unit)=68:25:7.

[Chem. 30]

Fluorine-containing copolymer 5

MA-CH2-OFCP    p-HO-St    BTFBE

<GPC Measurement Results>
Mw=16,100, Mw/Mn=1.5

2-6. Synthesis of Fluorine-Containing Copolymer 6

A fluorine-containing copolymer 6 containing the following repeating units was synthesized in the same manner as

[Chem. 32]

Fluorine-containing copolymer 7

HFIP-M    HEMA    VAc

<GPC Measurement Results>
Mw=55,500, Mw/Mn=2.1

2-8. Synthesis of Fluorine-Containing Copolymer 8

To a 300-ml glass flask equipped with a stirrer were collected 84.6 g (0.2 mol) of MA-C6F, 31.7 g (0.2 mol) of p-acetoxystyrene (AcO-St), 11.2 g (0.06 mol) of BTFBE, and 127 g of THF at room temperature, and 2.2 g (0.0135 mol) of AIBN was further added, followed by deaeration with stirring. After purging the atmosphere inside the flask with nitrogen gas, the contents were heated to a temperature of 70° C. and reacted for six hours. After decompression of the reaction system to remove THF, 850 g of n-heptane was added dropwise to the reaction system, whereby a clear viscous substance was precipitated. A supernatant of the viscous substance was separated by decantation. The viscous substance was dissolved in 100 g of methanol, and 10.1 g (0.1 mol) of triethylamine (TEA) was added thereto. The solution was heated to 50° C. and stirred for eight hours for solvolysis of an acetoxy group. After elimination of the acetoxy group was confirmed, the solution was concentrated and dried under reduced pressure at a temperature of 60° C., whereby 95 g of a fluorine-containing copolymer 8 in the form of a white solid was obtained at a yield of 86%.

<NMR Measurement Results>

The content ratio of the repeating units in the fluorine-containing copolymer 8 in terms of the molar ratio was (MA-C6F-derived repeating unit):(p-HO-St-derived repeating unit):(BTFBE-derived repeating unit)=30:50:20.

[Chem. 33]

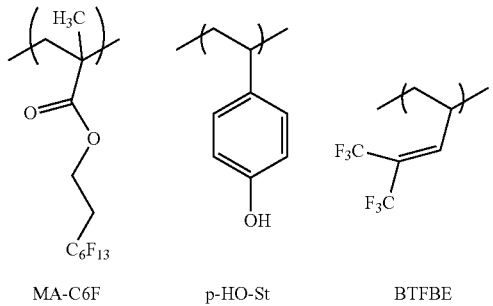

Fluorine-containing copolymer 8

MA-C6F    p-HO-St    BTFBE

<GPC Measurement Results>
Mw=7,500, Mw/Mn=1.4

2-9. Synthesis of Fluorine-Containing Copolymer 9

To a 300-ml glass flask equipped with a stirrer were collected 110.5 g (0.26 mol) of MA-C6F, 45.9 g (0.31 mol) of p-vinylbenzoic acid (VBA), 16.0 g (0.09 mol) of BTFBE, and 340 g of ethyl methyl ketone (MEK), and 10.8 g (0.065 mol) of AIBN was further added, followed by deaeration with stirring. After purging the atmosphere inside the flask with nitrogen gas, the contents were heated to a temperature of 75° C. and reacted for six hours. After decompression of the reaction system to remove MEK, 1350 g of n-heptane was added dropwise to the reaction system, whereby a white precipitate was obtained. After filtration, the residue was dried under reduced pressure at 60° C., whereby 146.2 g of a fluorine-containing copolymer 9 in the form of a thick white solid was obtained at a yield of 85%.

<NMR Measurement Results>

The content ratio of the repeating units in the fluorine-containing copolymer 9 in terms of the molar ratio was (MA-C6F-derived repeating unit):(VBA-derived repeating unit):(BTFBE-derived repeating unit)=30:50:20.

[Chem. 34]

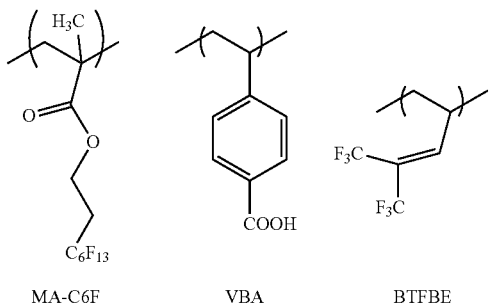

Fluorine-containing copolymer 9

MA-C6F    VBA    BTFBE

<GPC Measurement Results>
Mw=8,000, Mw/Mn=1.4

3. Synthesis of Comparative Polymer 3-1. Synthesis of Comparative Polymer 1

To a 300-ml glass flask equipped with a stirrer were collected 236.2 g (1 mol) of HFIP-M and 450 g of butyl acetate at room temperature, and 8 g (0.05 mol) of AIBN was further added, followed by deaeration with stirring. After purging the atmosphere inside the flask with nitrogen gas, the contents were heated to 80° C. and reacted for six hours. The reaction system was added dropwise to 500 g of n-heptane, whereby a white precipitate was obtained. After filtration, the residue was dried under reduced pressure at 60° C., whereby 165 g of a comparative polymer 1 containing a HFIP-M-derived repeating unit alone, in the form of a white solid, was obtained at a yield of 70%.

[Chem. 35]

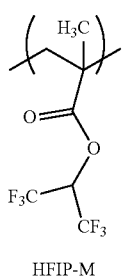

Comparative polymer 1

HFIP-M

<GPC Measurement Results>
Mw=11,200, Mw/Mn=1.4

3-2. Synthesis of Comparative Polymer 2

To a 300-ml glass flask equipped with a stirrer were collected 43.2 g (0.1 mol) of MA-C6F and 85 g of butyl acetate at room temperature, and 0.8 g (0.005 mol) of AIBN was further added, followed by deaeration with stirring. After purging the atmosphere inside the flask with nitrogen gas, the contents were heated to 80° C. and reacted for six hours. The contents were added dropwise to 500 g of n-heptane, whereby a white precipitate was obtained. After filtration, the residue was dried under reduced pressure at 60° C., whereby 32 g of a comparative polymer 2 containing a MA-C6F-derived repeating unit, in the form of a white solid, was obtained at a yield of 74%.

[Chem. 36]

Comparative polymer 2

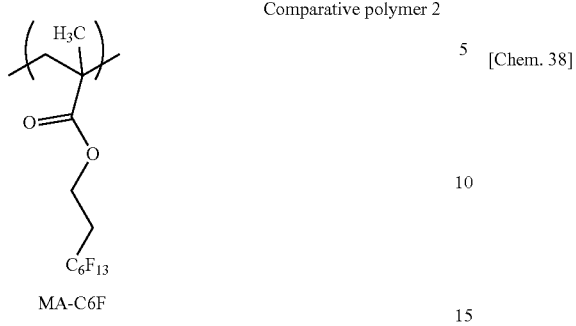

MA-C6F

<GPC Measurement Results>
Mw=13,800, Mw/Mn=1.6

3-3. Synthesis of Comparative Polymer 3

To a 300-ml glass flask equipped with a stirrer were collected 23.6 g (0.1 mol) of HFIP-M, 43.2 g (0.1 mol) of MA-C6F, and 130 g of butyl acetate at room temperature, and 0.8 g (0.005 mol) of AIBN was further added, followed by deaeration with stirring. After purging the atmosphere inside the flask with nitrogen gas, the contents were heated to 80° C. and reacted for six hours. The contents after completion of the reaction were added dropwise to 500 g of n-heptane, whereby a white precipitate was obtained. After filtration, the residue was dried under reduced pressure at 60° C., whereby 53 g of a comparative polymer 3 in the form of a white solid was obtained at a yield of 80%.

<NMR Measurement Results>

The content ratio of the repeating units in the comparative polymer 3 in terms of the molar ratio is (HFIP-M-derived repeating unit):(MA-C6F-derived repeating unit)=51:49.

[Chem. 37]

Comparative polymer 3

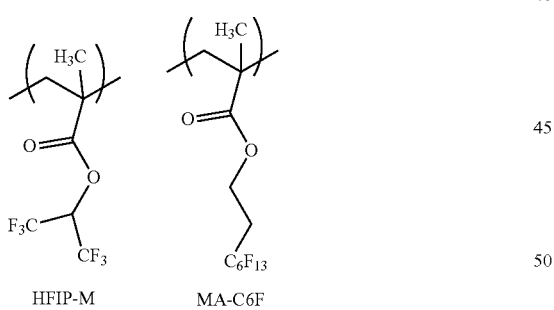

HFIP-M    MA-C6F

<GPC Measurement Results>
Mw=14,700, Mw/Mn=1.7

3-4. Synthesis of Comparative Polymer 4

The following synthesis was carried out based on Synthesis Example 6 of Patent Literature 4.

To a 300-ml glass flask equipped with a stirrer were collected 2.50 g of a condensate of 4-hydroxyphenyl methacrylate and 1,2-naphthoquinone-2-diazide-5-sulfonyl chloride (HPMA-QD), 0.70 g of methacrylic acid (MAA), 5.26 g of MA-C6F, 2.58 g of methacryloxypropyl tris(trimethylsiloxy)silane (MA-P-TTMS), 1.46 g of N-cyclohexylmaleimide (N-CyM), and 51.3 g of cyclohexanone at room temperature, and 0.33 g of AIBN was further added, followed by stirring at 110° C. for 20 hours. Thus, a comparative polymer 4 containing the following repeating units and having a solid content of 20% by mass was obtained.

[Chem. 38]

Comparative polymer 4

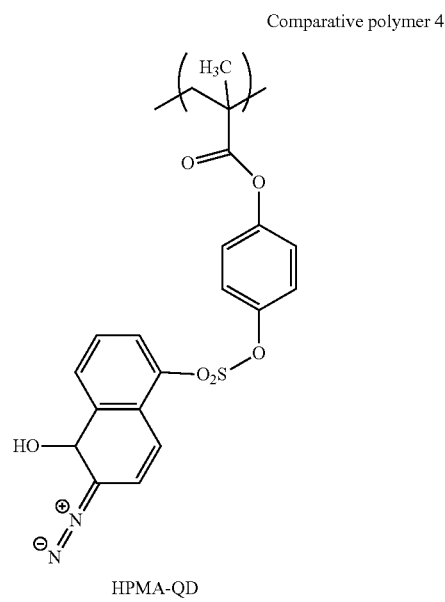

HPMA-QD

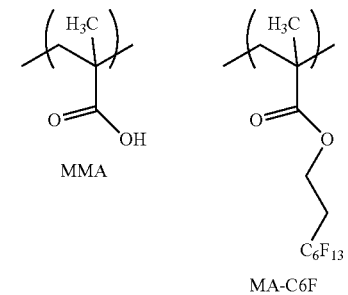

MMA    MA-C6F

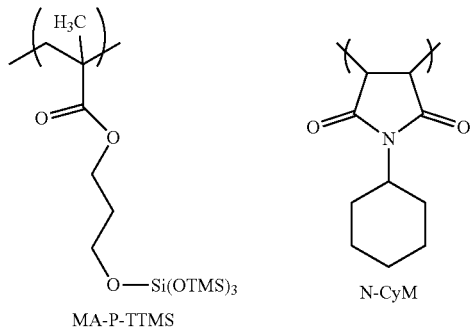

MA-P-TTMS    N-CyM

<GPC Measurement Results>
Mw=11,000, Mw/Mn=1.5

3-5. Synthesis of Comparative Polymer 5

To a 300-ml glass flask equipped with a stirrer were collected 7.2 g (0.083 mol) of methacrylic acid (MAA), 9.6 g (0.022 mol) of MA-C6F, 7.2 g (0.055 mol) of 2-hydroxyethyl methacrylate (HEMA), and 55 g of ethyl methyl ketone, and 0.6 g (0.004 mol) of AIBN was further added, followed by stirring at 75° C. for six hours. The contents after completion of the reaction were added dropwise to 500 g of n-heptane, whereby a white precipitate was obtained. After filtration, the residue was dried under reduced pressure at a temperature of 60° C., whereby 19 g of a comparative polymer 5 in the form of a white solid was obtained at a yield of 80%.

<NMR Measurement Results>

The content ratio of the repeating units in the comparative polymer 5 in terms of the molar ratio was (MA-C6F-derived repeating unit):(MAA-derived repeating unit):(HEMA-derived repeating unit)=14:52:34.

[Chem. 39]

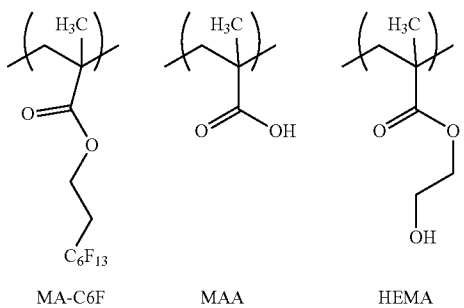

Comparative polymer 5

<GPC Measurement Results>
Mw=5,000, Mw/Mn=1.4

3-6. Molar Ratio of Repeating Units and Molecular Weight of Fluorine-Containing Copolymers 1 to 9 and Comparative Polymers 1 to 5

Table 1 shows the repeating units contained and the molar ratios thereof, the weight average molecular weights (Mw), the molecular weight dispersion (Mw/Mn), and the yields of the obtained fluorine-containing copolymers 1 to 9 and comparative polymers 1 to 5.

TABLE 1

| Polymer | Composition (repeating units) (mol %) | | | Molecular weight | | Yield |
| | A | B | C | Mw | Mw/Mn | (%) |
| --- | --- | --- | --- | --- | --- | --- |
| Fluorine-containing copolymer 1 | MA-C6F 28 | — | BTFBE 72 | 7,300 | 1.4 | 37 |
| Fluorine-containing copolymer 2 | MA-C6F 17 | 4-HFASt 37 | BTFBE 46 | 13,300 | 1.3 | 52 |
| Fluorine-containing copolymer 3 | MA-C6F 12 | p-HO-St 38 | BTFBE 50 | 17,500 | 1.4 | 55 |
| Fluorine-containing copolymer 4 | HFIP-M 15 | p-HO-St 39 | BTFBE 46 | 15,200 | 1.4 | 51 |
| Fluorine-containing copolymer 5 | MA-CH2-OFCP 13 | p-HO-St 38 | BTFBE 49 | 16,100 | 1.5 | 54 |
| Fluorine-containing copolymer 6 | V-C6F 10 | p-HO-St 38 | BTFBE 52 | 11,900 | 1.4 | 41 |
| Fluorine-containing copolymer 7 | HFIP-M 68 | HEMA 25 | VAc 7 | 55,500 | 2.1 | 78 |
| Fluorine-containing copolymer 8 | MA-C6F 30 | p-HO-St 50 | BTFBE 20 | 7,500 | 1.4 | 86 |
| Fluorine-containing copolymer 9 | MA-C6F 30 | VBA 50 | BTFBE 20 | 8,000 | 1.4 | 85 |
| Comparative polymer 1 | HFIP-M 100 | — | — | 11,200 | 1.4 | 70 |
| Comparative polymer 2 | MA-C6F 100 | — | — | 13,800 | 1.6 | 74 |
| Comparative polymer 3 | HFIP-M 51 MA-C6F 49 | — | — | 14,700 | 1.7 | 80 |
| Comparative polymer 4 | Composition disclosed in Patent Literature 4 | | | 11,000 | 1.5 | — |
| Comparative polymer 5 | MA-C6F 14 | HEMA 34 MAA 52 | — | 5,000 | 1.4 | 80 |

MA-C6F: 2-(Perfluorohexyl)ethyl methacrylate
BTFBE: 1,1-Bis(trifluoromethyl)butadiene
4-HFA-St: 1,1,1,3,3,3-Hexafluoro-2-(4-vinylphenyl)propan-2-ol
HO-St: p-Hydroxystyrene
VBA: p-Vinylbenzoic acid
HFIP-M: Hexafluoroisopropyl methacrylate
MA-CH2-OFCP: synthesized in example
V-C6F: 2-(Perfluorohexyl)ethyl vinyl ether
HEMA: 2-Hydroxyethyl methacrylate
Vac: Vinyl acetate
MAA: Methacrylic acid
"—" in the table means "not contained"

4. Lyophobicity of Each Polymer Film Before and after UV/Ozone Cleaning or Oxygen Plasma Cleaning and after Heating A film was formed on a silicon wafer using each of the fluorine-containing copolymers 1 to 9 and comparative polymers 1 to 5. The contact angle with water, anisole, propylene glycol monomethyl ether acetate (PGMEA), or xylene was measured before and after UV/ozone cleaning or oxygen plasma cleaning and after heating. Water, anisole, PGMEA, and xylene are each usable as an ink solvent.

[Production of Silicon Wafer with Film]

Each of the fluorine-containing copolymers 1 to 6, 8, and 9 and comparative polymers 1 to 5 was dissolved in propylene glycol monomethyl ether acetate (PGMEA) to a concentration to provide a predetermined film thickness and applied onto a silicon wafer using a spin coater, thereby forming a coat. Then, the silicon wafer was heated on a hot plate at 230° C. for 60 minutes to obtain a silicon wafer with a film.

The fluorine-containing copolymer 7 contains many OH groups, and crosslinking of the OH groups leads to exhibition of lyophobicity. After preparation of the following coating liquid, the coating liquid was applied onto a silicon wafer using a spin coater to form a coat. Then, the silicon wafer was pre-baked on a hot plate at 100° C. for 150 seconds, and the entire surface of the film was subjected to exposure and heated at 230° C. for 60 minutes. The exposure device used was Mask Aligner MA 6 produced by SUSS MicroTec KK.

[Preparation of Coating Liquid Containing Fluorine-Containing Copolymer 7]

An amount of 1 g of the fluorine-containing copolymer 7, 0.2 g of 2,4,6-tris[bis(methoxymethyl)amino]-1,3,5-triazine as a crosslinking agent, and 0.01 g of a photoacid generator (2-[2-(4-methylphenyl sulfonyloxyimino)thiophen-3(2H)-ylidene]-2-(2-methylphenyl)acetonitrile) were dissolved in 4 g of PGMEA, and the solution was stirred at room temperature for three hours, whereby a coating liquid containing the fluorine-containing copolymer 7 was prepared. The photoacid generator was decomposed by the exposure after formation of a coat to generate an acid, and crosslinking caused by the acid reduced the OH groups. Thus, lyophobicity was obtained.

[Cleaning Step and Heating Step]

The UV/ozone cleaning device used was PL17-110 produced by Sen Lights Co., Ltd. The oxygen plasma cleaning device used was Plasma dry cleaner PDC210 produced by Yamato Scientific Co., Ltd. Using such a device, each silicon wafer with a film was subjected to UV/ozone cleaning or oxygen plasma cleaning for 10 minutes. Then, the silicon wafer was heated at 200° C. for 60 seconds.

[Measurement of Contact Angle]

The contact angle of the film surface on the silicon wafer with water, anisole, PGMEA, or xylene was measured before and after UV/ozone cleaning or oxygen plasma cleaning and after the subsequent heating using a contact angle meter (DMs-601 produced by Kyowa Interface Science Co., Ltd.).

[Measurement of Film Thickness]

The thickness of the film on the silicon wafer was measured using a contact-type film thickness meter before and after UV/ozone cleaning or oxygen plasma cleaning and after the subsequent heating.

[Measurement of Molecular Weight]

The film on the silicon wafer was dissolved in THF and the molecular weight was measured by GPC described above before and after UV/ozone cleaning or oxygen plasma cleaning and after the subsequent heating.

Table 2 shows the contact angle with water or anisole and the film thickness measured before and after UV/ozone cleaning and after the subsequent heating.

TABLE 2

| | | Contact angle (°) | | | | | | Film thickness (nm) | | |
| | | Water | | | Anisole | | | | | |
| | | UV/ozone cleaning | | After | UV/ozone cleaning | | After | UV/ozone cleaning | | After |
| Example | Polymer | Before | After | heating | Before | After | heating | Before | After | heating |
| --- | --- | --- | --- | --- | --- | --- | --- | --- | --- | --- |
| Example 1 | Fluorine-containing copolymer 1 | 105 | 92 | 105 | 77 | 45 | 76 | 1800 | 1710 | 1659 |
| Example 2 | Fluorine-containing copolymer 2 | 101 | 78 | 99 | 58 | 38 | 56 | 1780 | 1720 | 1670 |
| Example 3 | Fluorine-containing copolymer 3 | 110 | 61 | 102 | 63 | 35 | 61 | 1900 | 1700 | 1650 |
| Example 4 | Fluorine-containing copolymer 4 | 102 | 61 | 100 | 55 | 33 | 54 | 1850 | 1680 | 1640 |
| Example 5 | Fluorine-containing copolymer 5 | 98 | 71 | 95 | 54 | 37 | 52 | 1950 | 1800 | 1770 |
| Example 6 | Fluorine-containing copolymer 6 | 105 | 77 | 103 | 63 | 39 | 62 | 1900 | 1750 | 1720 |
| Example 7 | Fluorine-containing copolymer 7 | 102 | 64 | 101 | 62 | 33 | 59 | 1750 | 1680 | 1590 |
| Example 8 | Fluorine-containing copolymer 8 | 106 | 55 | 105 | 70 | 34 | 71 | 1900 | 1800 | 1750 |
| Example 9 | Fluorine-containing copolymer 9 | 104 | 72 | 104 | 68 | 55 | 68 | 1900 | 1810 | 1760 |
| Comparative Example 1 | Comparative polymer 1 | 105 | 61 | 68 | 61 | 28 | 33 | 1450 | 360 | 250 |
| Comparative Example 2 | Comparative polymer 2 | 115 | 88 | 98 | 85 | 37 | 45 | 1900 | 510 | 450 |
| Comparative Example 3 | Comparative polymer 3 | 110 | 72 | 90 | 77 | 31 | 38 | 1700 | 450 | 410 |
| Comparative Example 4 | Comparative polymer 4 | 101 | 89 | 90 | 55 | 47 | 49 | 1990 | 1960 | 1950 |
| Comparative Example 5 | Comparative polymer 5 | 101 | 35 | 20 | 54 | 26 | 31 | 1990 | 730 | 500 |

As shown in Table 2, in the case of the film containing any of the fluorine-containing copolymers 1 to 9 on the silicon wafer, the contact angles with water and anisole were decreased after UV/ozone cleaning but recovered after heating to almost the same angles as those before UV/ozone cleaning. In comparison, the contact angles in the case of any of the comparative polymers 1 to 5 were only slightly recovered by heating.

Table 3 shows the contact angle with water or anisole and the film thickness measured before and after oxygen plasma cleaning and after the subsequent heating.

TABLE 3

| | | Contact angle (°) | | | | | | Film thickness (nm) | | |
|---|---|---|---|---|---|---|---|---|---|---|
| | | Water | | | Anisole | | | | | |
| | | Oxygen plasma cleaning | | After | Oxygen plasma cleaning | | After | Oxygen plasma cleaning | | After |
| Example | Polymer | Before | After | heating | Before | After | heating | Before | After | heating |
| Example 1 | Fluorine-containing copolymer 1 | 105 | 89 | 104 | 77 | 45 | 75 | 1800 | 1680 | 1580 |
| Example 2 | Fluorine-containing copolymer 2 | 101 | 75 | 99 | 58 | 36 | 57 | 1780 | 1670 | 1620 |
| Example 3 | Fluorine-containing copolymer 3 | 110 | 55 | 103 | 63 | 31 | 62 | 1900 | 1650 | 1600 |
| Example 4 | Fluorine-containing copolymer 4 | 102 | 54 | 101 | 55 | 32 | 55 | 1850 | 1600 | 1590 |
| Example 5 | Fluorine-containing copolymer 5 | 98 | 65 | 94 | 54 | 35 | 53 | 1950 | 1750 | 1720 |
| Example 6 | Fluorine-containing copolymer 6 | 105 | 70 | 104 | 63 | 33 | 60 | 1900 | 1700 | 1670 |
| Example 7 | Fluorine-containing copolymer 7 | 102 | 59 | 101 | 62 | 35 | 58 | 1750 | 1600 | 1530 |
| Example 8 | Fluorine-containing copolymer 8 | 106 | 50 | 105 | 70 | 31 | 70 | 1900 | 1740 | 1700 |
| Example 9 | Fluorine-containing copolymer 9 | 104 | 68 | 104 | 68 | 50 | 69 | 1900 | 1790 | 1710 |
| Comparative Example 1 | Comparative polymer 1 | 105 | 52 | 70 | 61 | 28 | 21 | 1450 | 300 | 190 |
| Comparative Example 2 | Comparative polymer 2 | 115 | 89 | 92 | 85 | 35 | 26 | 1900 | 410 | 390 |
| Comparative Example 3 | Comparative polymer 3 | 110 | 61 | 84 | 77 | 31 | 27 | 1700 | 350 | 360 |
| Comparative Example 4 | Comparative polymer 4 | 101 | 91 | 87 | 55 | 46 | 46 | 1990 | 1900 | 1870 |
| Comparative Example 5 | Comparative polymer 5 | 101 | 29 | 15 | 54 | 26 | 18 | 1990 | 650 | 360 |

As shown in Table 3, in the case of the film containing any of the fluorine-containing copolymers 1 to 9 on the silicon wafer, the contact angles with water and anisole were decreased after oxygen plasma cleaning but recovered after heating to almost the same angles as those before oxygen plasma cleaning. In comparison, the contact angles in the case of any of the comparative polymers 1 to 5 were only slightly recovered by heating.

Table 4 shows the contact angle with PGMEA or xylene and the film thickness measured before and after UV/ozone cleaning and after the subsequent heating.

TABLE 4

| | | Contact angle (°) | | | | | | Film thickness (nm) | | |
|---|---|---|---|---|---|---|---|---|---|---|
| | | PGMEA | | | Xylene | | | | | |
| | | UV/ozone cleaning | | After | UV/ozone cleaning | | After | UV/ozone cleaning | | After |
| Example | Polymer | Before | After | heating | Before | After | heating | Before | After | heating |
| Example 1 | Fluorine-containing copolymer 1 | 61 | 35 | 61 | 66 | 38 | 65 | 1800 | 1710 | 1659 |
| Example 2 | Fluorine-containing copolymer 2 | 45 | 26 | 44 | 51 | 33 | 51 | 1780 | 1720 | 1670 |
| Example 3 | Fluorine-containing copolymer 3 | 48 | 26 | 48 | 53 | 30 | 53 | 1900 | 1700 | 1650 |
| Example 4 | Fluorine-containing copolymer 4 | 42 | 25 | 41 | 55 | 34 | 54 | 1850 | 1680 | 1640 |

TABLE 4-continued

| Example | Polymer | Contact angle (°) | | | | | | Film thickness (nm) | | |
| --- | --- | --- | --- | --- | --- | --- | --- | --- | --- | --- |
| | | PGMEA | | | Xylene | | | | | |
| | | UV/ozone cleaning | | After heating | UV/ozone cleaning | | After heating | UV/ozone cleaning | | After heating |
| | | Before | After | | Before | After | | Before | After | |
| Example 5 | Fluorine-containing copolymer 5 | 42 | 21 | 42 | 49 | 28 | 48 | 1950 | 1800 | 1770 |
| Example 6 | Fluorine-containing copolymer 6 | 49 | 24 | 48 | 53 | 24 | 53 | 1900 | 1750 | 1720 |
| Example 7 | Fluorine-containing copolymer 7 | 47 | 25 | 44 | 51 | 26 | 49 | 1750 | 1680 | 1590 |
| Example 8 | Fluorine-containing copolymer 8 | 53 | 30 | 54 | 59 | 39 | 60 | 1900 | 1800 | 1750 |
| Example 9 | Fluorine-containing copolymer 9 | 52 | 22 | 53 | 60 | 22 | 60 | 1900 | 1810 | 1760 |
| Comparative Example 1 | Comparative polymer 1 | 45 | 20 | 18 | 51 | 21 | 16 | 1450 | 360 | 250 |
| Comparative Example 2 | Comparative polymer 2 | 65 | 21 | 17 | 69 | 25 | 20 | 1900 | 510 | 450 |
| Comparative Example 3 | Comparative polymer 3 | 66 | 20 | 15 | 70 | 22 | 14 | 1700 | 450 | 410 |
| Comparative Example 4 | Comparative polymer 4 | 45 | 41 | 40 | 50 | 46 | 43 | 1990 | 1960 | 1950 |
| Comparative Example 5 | Comparative polymer 5 | 42 | 21 | 20 | 54 | 25 | 14 | 1990 | 730 | 500 |

As shown in Table 4, in the case of the film containing any of the fluorine-containing copolymers 1 to 9 on the silicon wafer, the contact angles with PGMEA and xylene were decreased after UV/ozone cleaning but recovered after heating to almost the same angles as those before UV/ozone cleaning. In comparison, the contact angles in the case of any of the comparative polymers 1 to 5 were only slightly recovered by heating.

Table 5 shows the contact angle with PGMEA or xylene and the film thickness measured before and after oxygen plasma cleaning and after the subsequent heating.

TABLE 5

| Example | Polymer | Contact angle (°) | | | | | | Film thickness (nm) | | |
| --- | --- | --- | --- | --- | --- | --- | --- | --- | --- | --- |
| | | PGMEA | | | Xylene | | | | | |
| | | Oxygen plasma cleaning | | After heating | Oxygen plasma cleaning | | After heating | Oxygen plasma cleaning | | After heating |
| | | Before | After | | Before | After | | Before | After | |
| Example 1 | Fluorine-containing copolymer 1 | 61 | 32 | 61 | 66 | 34 | 65 | 1800 | 1680 | 1580 |
| Example 2 | Fluorine-containing copolymer 2 | 45 | 21 | 45 | 51 | 28 | 50 | 1780 | 1670 | 1620 |
| Example 3 | Fluorine-containing copolymer 3 | 48 | 22 | 47 | 53 | 27 | 52 | 1900 | 1650 | 1600 |
| Example 4 | Fluorine-containing copolymer 4 | 42 | 20 | 40 | 55 | 30 | 55 | 1850 | 1600 | 1590 |
| Example 5 | Fluorine-containing copolymer 5 | 42 | 19 | 41 | 49 | 24 | 48 | 1950 | 1750 | 1720 |
| Example 6 | Fluorine-containing copolymer 6 | 49 | 20 | 47 | 53 | 21 | 52 | 1900 | 1700 | 1670 |
| Example 7 | Fluorine-containing copolymer 7 | 47 | 22 | 43 | 51 | 22 | 46 | 1750 | 1600 | 1530 |
| Example 8 | Fluorine-containing copolymer 8 | 53 | 28 | 53 | 59 | 34 | 59 | 1900 | 1740 | 1700 |
| Example 9 | Fluorine-containing copolymer 9 | 52 | 22 | 52 | 60 | 21 | 61 | 1900 | 1790 | 1710 |
| Comparative Example 1 | Comparative polymer 1 | 45 | 15 | 10 | 51 | 18 | 20 | 1450 | 300 | 190 |
| Comparative Example 2 | Comparative polymer 2 | 65 | 12 | 11 | 69 | 15 | 21 | 1900 | 410 | 390 |
| Comparative Example 3 | Comparative polymer 3 | 66 | 15 | 13 | 70 | 19 | 17 | 1700 | 350 | 360 |
| Comparative Example 4 | Comparative polymer 4 | 45 | 37 | 36 | 50 | 41 | 39 | 1990 | 1900 | 1870 |
| Comparative Example 5 | Comparative polymer 5 | 42 | 14 | 14 | 54 | 19 | 13 | 1990 | 650 | 360 |

As shown in Table 5, in the case of the film containing any of the fluorine-containing copolymers 1 to 9 on the silicon wafer, the contact angles with PGMEA and xylene were decreased after oxygen plasma cleaning but recovered after heating to almost the same angles as those before oxygen plasma cleaning. In comparison, the contact angles in the case of any of the comparative polymers 1 to 5 were only slightly recovered by heating.

Table 6 shows the results of the measurement by GPC described above performed on the film on the silicon wafer dissolved in THF before and after UV/ozone cleaning or oxygen plasma cleaning and after the subsequent heating.

TABLE 6

| | | Molecular weight (Mw) | | | | | |
|---|---|---|---|---|---|---|---|
| | | UV/ozone cleaning | | After | Oxygen plasma cleaning | | After |
| Example | Polymer | Before | After | heating | Before | After | heating |
| Example 1 | Fluorine-containing copolymer 1 | 7,300 | 6,900 | 6,800 | 7,300 | 6,900 | 6,800 |
| Example 2 | Fluorine-containing copolymer 2 | 13,300 | 12,800 | 13,300 | 13,300 | 13,300 | 13,300 |
| Example 3 | Fluorine-containing copolymer 3 | 17,500 | 16,900 | 16,700 | 17,500 | 16,400 | 16,000 |
| Example 4 | Fluorine-containing copolymer 4 | 15,200 | 14,800 | 14,500 | 15,200 | 14,600 | 14,200 |
| Example 5 | Fluorine-containing copolymer 5 | 16,100 | 15,900 | 15,400 | 16,100 | 15,500 | 15,000 |
| Example 6 | Fluorine-containing copolymer 6 | 11,900 | 11,000 | 10,900 | 11,900 | 10,800 | 10,500 |
| Example 7 | Fluorine-containing copolymer 7 | 55,500 | 48,000 | 43,000 | 55,500 | 45,000 | 42,000 |
| Example 8 | Fluorine-containing copolymer 8 | 7,500 | 7,400 | 7,350 | 7,500 | 7,400 | 7,300 |
| Example 9 | Fluorine-containing copolymer 9 | 8,000 | 7,800 | 7,800 | 8,000 | 7,800 | 7,800 |
| Comparative Example 1 | Comparative polymer 1 | 11,200 | 800 | 500 | 11,200 | 430 | 380 |
| Comparative Example 2 | Comparative polymer 2 | 13,800 | 1,100 | 610 | 13,800 | 510 | 450 |
| Comparative Example 3 | Comparative polymer 3 | 14,700 | 1,300 | 450 | 14,700 | 810 | 600 |
| Comparative Example 4 | Comparative polymer 4 | 11,000 | 9,000 | 8,800 | 11,000 | 8,000 | 7,800 |
| Comparative Example 5 | Comparative polymer 5 | 5,000 | 1,200 | 800 | 5,000 | 450 | 450 |

As shown in Table 6, the molecular weight measured by dissolving the film containing any of the fluorine-containing copolymers 1 to 9 on the silicon wafer in THF was not remarkably changed after UV/ozone cleaning or oxygen plasma cleaning, which shows that decomposition of the polymer was suppressed. In comparison, the molecular weight in the case of any of the comparative polymers 1 to 5 was confirmed to be remarkably reduced.

5. Evaluation as Resist

Resists 2, 3, and 7 and a comparative resist 4 were prepared using the fluorine-containing copolymers 2, 3, and 7 and the comparative polymer 4. The resist performances of these resists were evaluated and compared.

5-1. Preparation of Resist

[Resist 2]

To 1.6 g of the fluorine-containing copolymer 2 were added 20 g (solid content of 40% by mass) of BMR C-1000 (product name) that is a negative resist produced by Tokyo Ohka Kougyo Co., Ltd. and 0.2 g of TPA-100 (product name) that is an isocyanate-type crosslinking agent produced by Asahi Kasei Corporation. Thus, a resist 2 was prepared.

[Resist 3]

To 1.6 g of the fluorine-containing copolymer 3 were added 20 g (solid content of 40% by mass) of BMR C-1000 (product name) that is a negative resist produced by Tokyo Ohka Kougyo Co., Ltd., 0.2 g of 2,4,6-tris[bis(methoxymethyl)amino]-1,3,5-triazine as a crosslinking agent, and 0.01 g of a photoacid generator (2-[2-(4-methylphenyl sulfonyloxyimino)thiophen-3(2H)-ylidene]-2-(2-methylphenyl)acetonitrile). Thus, a resist 3 was prepared.

[Resist 7]

An amount of 1 g of the fluorine-containing copolymer 7, 0.2 g of 2,4,6-tris[bis(methoxymethyl)amino]-1,3,5-triazine as a crosslinking agent, and 0.01 g of a photoacid generator (2-[2-(4-methylphenyl sulfonyloxyimino)thiophene-3(2H)-ylidene]-2-(2-methylphenyl)acetonitrile) were dissolved in 4 g of PGMEA, and the solution was stirred at room temperature for three hours. Thus, a resist 7 containing the fluorine-containing copolymer 7 was prepared.

[Comparative Resist 4]

The positive photosensitive resin composition disclosed in Patent Literature 4 was prepared using the comparative polymer 4. Thus, a comparative resist 4 was obtained.

5-2. Formation of Resist Film

To a silicon wafer (4 inches in diameter) were sprayed super pure water and then acetone. After cleaning by spin coating, the silicon wafer was subjected to UV/ozone cleaning using the UV/ozone cleaning device described above for five minutes. Subsequently, the resists 2, 3, and 7 and comparative resist 4 were each filtered through a 0.2-μm membrane filter, and applied onto the silicon wafer using a spinner at a rotation speed of 1,000 rpm, followed by drying by heating on a hot plate at 100° C. for 150 seconds. Thus, a resist film having a thickness of 2 μm was formed on the silicon wafer.

5-3. Evaluation of Solubility of Resist in Developing Solution and Resolution of Resist Pattern Evaluation of the solubility of the resist in a developing solution and the resolution of the resist pattern and measurement of the contact angle were performed on each resist film on the silicon wafer. The methods for the measurement are described below.

The resist film formed on the silicon wafer was irradiated with i-line (wavelength of 365 nm) using the mask aligner described above through a mask (line and space of 5 μm). Thus, exposure was carried out. Then, the resist film was subjected to post-exposure bake at 120° C. for 60 seconds.

[Solubility in Developing Solution]

The silicon wafer with a resist film was immersed in an alkali developing solution or PGMEA at room temperature for 60 seconds before and after the exposure, and the solubility of the resist film in a developing solution or an organic solvent was evaluated. The alkali developing solution used was a 2.38% by mass aqueous solution of tetramethyl ammonium hydroxide (hereafter, also referred to as TMAH). The solubility of the resist film was evaluated by measuring the thickness of the resist film after immersion with an optical interference-type thickness meter. The case where the resist film was completely dissolved was evaluated as "Soluble" and the case where the resist film was not dissolved to remain was evaluated as "Insoluble".

[Sensitivity]

The optimum exposure dose Eop (mj/cm$^2$) upon formation of the pattern having the line and space mentioned above was obtained and determined as an index of the sensitivity.

[Resolution]

The resist pattern on the silicon wafer with a patterned film was examined under a microscope. The resist pattern with no line edge roughness observed was evaluated as "Excellent", the resist pattern with slight line edge roughness observed was evaluated as "Good", and the resist pattern with remarkable line edge roughness observed was evaluated as "Poor".

Table 7 shows the evaluation results on the solubility of each resist in a developing solution, and the sensitivity and resolution of the resist pattern.

<Evaluation on Solubility in Developing Solution>

As shown in Table 7, in the case of the resists 2 and 3, an unexposed part was soluble and an exposed part was insoluble in an alkali solution and PGMEA. In the case of the resist 7, an unexposed part was soluble and an exposed part was insoluble in PGMEA. These resists are usable as negative resists. In the case of the comparative resist 4, an exposed part is soluble in an alkali solution. The comparative resist 4 is therefore usable as a positive resist.

<Sensitivity>

The resist 3 and the comparative resist 4 exhibited the similar sensitivity. In comparison with these resists, the resist 7 exhibited higher sensitivity.

<Resolution>

The resist patterns formed using the resists 2, 3, and 7 and comparative resist 4 each had a line and space of 5 μm transferred from the mask at a high resolution. In particular, in the case of the resist 7, no line edge roughness was observed, and the resolution of the resist pattern was evaluated as "Excellent".

5-4. Evaluation on Lyophobicity Before and after UV/Ozone Cleaning and after Heating of Resist Pattern Measurement of the contact angle with anisole was performed on each of the resist films on the silicon wafers prepared using the resists 2, 3, and 7 and comparative resist 4 before and after UV/ozone cleaning and after the subsequent heating. The silicon wafer with a resist film was subjected to UV/ozone cleaning using the UV/ozone cleaning device described above for 10 minutes and then heated at 200° C. for 60 seconds. The contact angle meter used was produced by Kyowa Interface Science Co., Ltd.

TABLE 7

| | | Development | | | | Resist performance | |
| --- | --- | --- | --- | --- | --- | --- | --- |
| | | Solubility in alkali solution | | Solubility in PGMEA | | Sensitivity | |
| Resist | Polymer | Unexposed part | After exposure | Unexposed part | After exposure | (mJ/cm$^2$) | Resolution |
| Resist 2 (negative) | Fluorine-containing copolymer 2 | Soluble | Insoluble | Soluble | Insoluble | 230 | Good |
| Resist 3 (negative) | Fluorine-containing copolymer 3 | Soluble | Insoluble | Soluble | Insoluble | 120 | Good |
| Resist 7 (negative) | Fluorine-containing copolymer 7 | Insoluble | Insoluble | Soluble | Insoluble | 105 | Excellent |
| Comparative resist 4 (positive) | Comparative polymer 4 | Insoluble | Soluble | Insoluble | Insoluble | 120 | Good |

PGMEA: Propylene glycol monomethyl ether acetate

TABLE 8

| Resist | Polymer | Contact angle (°) | | | | | |
|---|---|---|---|---|---|---|---|
| | | Unexposed part | | | Exposed part | | |
| | | UV/ozone cleaning | | After heating | UV/ozone cleaning | | After heating |
| | | Before | After | | Before | After | |
| Resist 2 (negative) | Fluorine-containing copolymer 2 | 45 | 10 | 10 | 62 | 38 | 58 |
| Resist 3 (negative) | Fluorine-containing copolymer 3 | 47 | 10 | 10 | 65 | 37 | 63 |
| Resist 7 (negative) | Fluorine-containing copolymer 7 | 59 | 10 | 10 | 62 | 32 | 60 |
| Comparative resist 4 (positive) | Comparative polymer 4 | 55 | 48 | 50 | 42 | 10 | 10 |

[Measurement Results of Contact Angle]

As shown in Table 8, in the case of the resists 2, 3, and 7, the contact angle of an exposed part that served as a bank in the pattern with anisole was decreased by UV/ozone cleaning but increased by heating to recover the lyophobicity.

5-5. Evaluation on Lyophobicity Before and after Oxygen Plasma Cleaning and after Heating of Resist Pattern Measurement of the contact angle with anisole was performed on each of the resist films on the silicon wafers prepared using the resists 2, 3, and 7 and comparative resist 4 before and after oxygen plasma cleaning and after the subsequent heating. The silicon wafer with a resist film was subjected to oxygen plasma cleaning using the oxygen plasma cleaning device described above for 10 minutes and then heated at 200° C. for 60 seconds. The contact angle meter used was produced by Kyowa Interface Science Co., Ltd.

TABLE 9

| Resist | Polymer | Contact angle (°) | | | | | |
|---|---|---|---|---|---|---|---|
| | | Unexposed part | | | Exposed part | | |
| | | Oxygen plasma cleaning | | After heating | Oxygen plasma cleaning | | After heating |
| | | Before | After | | Before | After | |
| Resist 2 (negative) | Fluorine-containing copolymer 2 | 45 | 10 | 10 | 62 | 39 | 61 |
| Resist 3 (negative) | Fluorine-containing copolymer 3 | 47 | 10 | 10 | 65 | 36 | 65 |
| Resist 7 (negative) | Fluorine-containing copolymer 7 | 59 | 10 | 10 | 62 | 30 | 57 |
| Comparative resist 4 (positive) | Comparative polymer 4 | 55 | 45 | 45 | 42 | 10 | 10 |

[Measurement Results of Contact Angle]

As shown in Table 9, in the case of the resists 2, 3, and 7, the contact angle of an exposed part that served as a bank in the pattern with anisole was decreased by oxygen plasma cleaning but increased by heating to recover the lyophobicity.

INDUSTRIAL APPLICABILITY

The production method of a substrate with a patterned film of the present disclosure can allow a bank to have sufficient lyophobicity while maintaining the lyophilicity of a recess of a patterned film. The production method of a substrate with a patterned film of the present disclosure therefore can be used not only for production of a display element by an ink-jet method but also for production of an organic semiconductor film or a thin film of a colored resin or the like and production of display wiring and a device such as a thin film transistor.

The invention claimed is:

1. A method for producing a substrate with a patterned film, the method comprising:

a cleaning step of performing UV/ozone cleaning or oxygen plasma cleaning on a substrate with a patterned film to obtain a first substrate with a patterned film, the substrate with a patterned film comprising a substrate and a patterned film on the substrate, the patterned film containing a fluorine-containing copolymer, the fluorine-containing copolymer containing all of a repeating unit represented by the following formula (A), a repeating unit represented by the following formula (B), and a repeating unit represented by the following formula (C); and a heating step of heating the first substrate with a patterned film to obtain a second substrate with a patterned film, the formulas (A), (B), and (C) being:

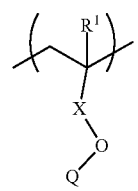

(A)

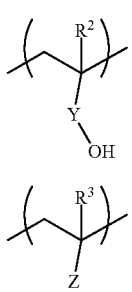

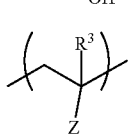

wherein R¹, R², and R³ are each independently a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X and Y are each independently a single bond or a divalent group; Z is a bis(trifluoromethyl)vinyl group; O is an oxygen atom; and His a hydrogen atom.

2. The production method according to claim 1, wherein the first substrate with a patterned film is heated at 50° C. or higher but 350° C. or lower for 10 seconds or longer in the heating step.

3. The production method according to claim 1, wherein the second substrate with a patterned film is a substrate for forming a display element by an ink-jet method.

4. The production method according to claim 1, wherein Q is a C3-C10 fluoroalkyl group and X is a carbonyl group in the repeating unit represented by the formula (A).

5. The production method according to claim 4, wherein Q is a perfluorohexyl ethyl group and X is a carbonyl group in the repeating unit represented by the formula (A).

6. The production method according to claim 4, wherein Q is a hexafluoroisopropyl group and X is a carbonyl group in the repeating unit represented by the formula (A).

7. The production method according to claim 1, wherein the repeating unit represented by the formula (A) is a repeating unit represented by the following formula (A-1):

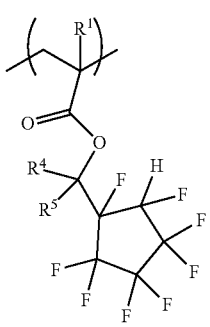

wherein R⁴ and R⁵ are each independently a hydrogen atom, a fluorine atom, or a C1-C3 alkyl group in which hydrogen atoms bonded to a carbon atom are optionally partly or entirely replaced by fluorine atoms; O is an oxygen atom; His a hydrogen atom; and F is a fluorine atom.

8. The production method according to claim 1, wherein Q is a hexafluoroisopropyl group and X is a carbonyl group in the repeating unit represented by the formula (A), and Y is a p-phenylene group or a carboxyethylene group in the repeating unit represented by the formula (B).

9. A method for producing a substrate with a patterned film, the method comprising:

a cleaning step of performing UV/ozone cleaning or oxygen plasma cleaning on a substrate with a patterned film to obtain a first substrate with a patterned film, the substrate with a patterned film comprising a substrate and a patterned film on the substrate, the patterned film containing a fluorine-containing copolymer, the fluorine-containing copolymer containing all of a repeating unit represented by the following formula (A), a repeating unit represented by the following formula (B), and a repeating unit represented by the following formula (C); and a heating step of heating the first substrate with a patterned film to obtain a second substrate with a patterned film, the formulas (A), (B), and (C) being:

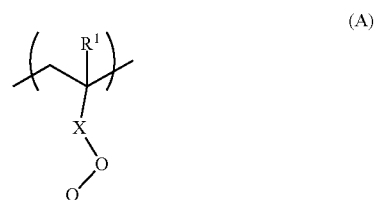

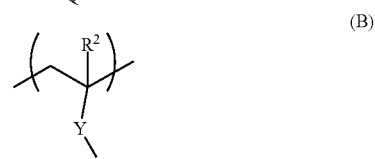

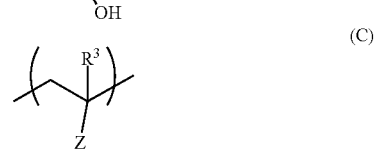

wherein R1, R2 and R3 are each independently a hydrogen atom, a fluorine atom, or a C1-C20 alkyl group in which hydrogen atoms bonded to a carbon atom are optionally partly or entirely replaced by fluorine atoms; Q is a C3-C10 fluoroalkyl group and X is a carbonyl group; Y is a p-phenylene group, a p-phenylene carbonyl group, or a p-phenylene hexafluoroisopropylene group; Z is a bis(trifluoromethyl)vinyl group; O is an oxygen atom; and His a hydrogen atom.

10. The production method according to claim 9, wherein the first substrate with a patterned film is heated at 50° C. or higher but 350° C. or lower for 10 seconds or longer in the heating step.

11. The production method according to claim 9, wherein the second substrate with a patterned film is a substrate for forming a display element by an ink-jet method.

12. The production method according to claim 9,
wherein Q is a perfluorohexyl ethyl group and X is a carbonyl group in the repeating unit represented by the formula (A).

13. The production method according to claim 9,
wherein Q is a hexafluoroisopropyl group and X is a carbonyl group in the repeating unit represented by the formula (A).

14. A fluorine-containing copolymer comprising all of a repeating unit represented by the following formula (A), a repeating unit represented by the following formula (B), and a repeating unit represented by the following formula (C):

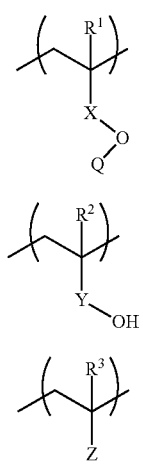

(A)

(B)

(C)

wherein $R^1$, $R^2$, and $R^3$ are each independently a hydrogen atom, a fluorine atom, or a C1-C20 alkyl group in which hydrogen atoms bonded to a carbon atom are optionally partly or entirely replaced by fluorine atoms; Q is a C1-C20 fluoroalkyl group optionally containing a hydrogen atom, an oxygen atom, or a nitrogen atom; X and Y are each independently a single bond or a divalent group; Z is a bis(trifluoromethyl)vinyl group; O is an oxygen atom; and H is a hydrogen atom.

15. The fluorine-containing copolymer according to claim 14,
wherein Q is a C3-C10 fluoroalkyl group and X is a carbonyl group in the repeating unit represented by the formula (A), and Z is a bis(trifluoromethyl)vinyl group in the repeating unit represented by the formula (C).

16. The fluorine-containing copolymer according to claim 14, wherein Q is a C3-C10 fluoroalkyl group and X is a carbonyl group in the repeating unit represented by the formula (A), Y is a p-phenylene group, a p-phenylene carbonyl group, or a p-phenylene hexafluoroisopropylene group in the repeating unit represented by the formula (B), and $R^3$ is a hydrogen atom or a methyl group and Z is a bis(trifluoromethyl)vinyl group in the repeating unit represented by the formula (C).

17. A fluorine-containing copolymer comprising all of a repeating unit represented by the following formula (A), a repeating unit represented by the following formula (B), and a repeating unit represented by the following formula (C):

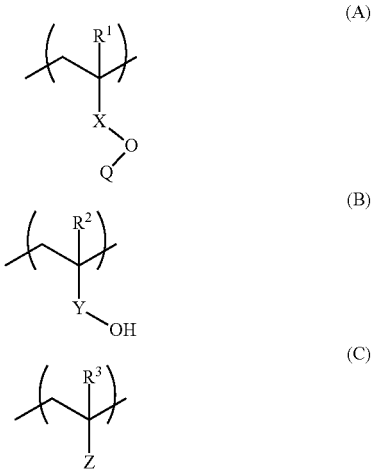

(A)

(B)

(C)

wherein R1, R2 and R3 are each independently a hydrogen atom, a fluorine atom, or a C1-C20 alkyl group in which hydrogen atoms bonded to a carbon atom are optionally partly or entirely replaced by fluorine atoms; Q is a C3-C10 fluoroalkyl group and X is a carbonyl group; Y is a p-phenylene group, a p-phenylene carbonyl group, or a p-phenylene hexafluoroisopropylene group; Z is a bis(trifluoromethyl)vinyl group; O is an oxygen atom; and H is a hydrogen atom.

* * * * *